US010559752B2

(12) United States Patent
Park et al.

(10) Patent No.: US 10,559,752 B2
(45) Date of Patent: Feb. 11, 2020

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Il Mok Park, Seoul (KR); Tae Jin Park, Yongin-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 63 days.

(21) Appl. No.: 15/678,583

(22) Filed: Aug. 16, 2017

(65) Prior Publication Data
US 2018/0159032 A1    Jun. 7, 2018

(30) Foreign Application Priority Data
Dec. 5, 2016   (KR) .......................... 10-2016-0164249

(51) Int. Cl.
    *H01L 45/00*    (2006.01)
    *H01L 27/24*    (2006.01)
(52) U.S. Cl.
    CPC ........ *H01L 45/1293* (2013.01); *H01L 27/249* (2013.01); *H01L 27/2427* (2013.01);
    (Continued)
(58) Field of Classification Search
    CPC ............... H01L 27/249; H01L 45/1293; H01L 27/2427; H01L 27/2481; H01L 45/06;
    (Continued)

(56) References Cited

U.S. PATENT DOCUMENTS 5,359,205 A * 10/1994 Ovshinsky .............. G11C 11/56
                                                      257/3
5,477,071 A * 12/1995 Hamamoto ........... H01L 27/108
                                                      257/302
(Continued)

FOREIGN PATENT DOCUMENTS

KR   1020130112529   10/2013
KR   1020140081168   7/2014

OTHER PUBLICATIONS

Kau et. al., "A stackable cross point phase change memory," Electron Devices Meeting (IEDM), 2009 IEEE International, Dec. 7-9, 2009.*

*Primary Examiner* — Ismail A Muse
*Assistant Examiner* — Charles N Ausar-El
(74) *Attorney, Agent, or Firm* — F. Chau & Associates, LLC

(57) ABSTRACT

A semiconductor device includes a first word line and a first bit line. The semiconductor device further includes a mold film disposed between the first word line and the first bit line, and a first memory cell disposed in the mold film. The first memory cell includes a first lower electrode in contact with the first word line. Side surfaces of the first lower electrode are in direct contact with the mold film. The first memory cell includes a first phase-change memory in contact with the first lower electrode, a first intermediate electrode in contact with the first phase-change memory, a first ovonic threshold switch (OTS) in contact with the first intermediate electrode, and a first upper electrode disposed between the first OTS and the first bit line, the first upper electrode in contact with the first OTS and the first bit line.

18 Claims, 17 Drawing Sheets

(52) U.S. Cl.
CPC .......... *H01L 45/065* (2013.01); *H01L 45/124* (2013.01); *H01L 45/126* (2013.01); *H01L 45/141* (2013.01); *H01L 45/1683* (2013.01)

(58) Field of Classification Search
CPC . H01L 45/065; H01L 45/1233; H01L 45/124; H01L 45/126; H01L 45/141; H01L 45/1683
See application file for complete search history.

(56) References Cited

U.S. PATENT DOCUMENTS

| | | | |
|---|---|---|---|
| 7,271,081 B2* | 9/2007 | Li | H01L 29/66143 257/E21.091 |
| 7,436,692 B2* | 10/2008 | Pellizzer | H01L 27/2463 257/E27.004 |
| 7,696,077 B2* | 4/2010 | Liu | H01L 27/2463 257/3 |
| 7,981,797 B2 | 7/2011 | Ryu et al. | |
| 8,263,963 B2 | 9/2012 | Park et al. | |
| 8,378,456 B1* | 2/2013 | Shepard | H01L 27/1026 257/563 |
| 8,426,976 B2* | 4/2013 | Ishiduki | H01L 27/11565 257/324 |
| 8,507,353 B2 | 8/2013 | Oh et al. | |
| 8,513,136 B2 | 8/2013 | Park et al. | |
| 8,541,768 B2* | 9/2013 | Shima | H01L 27/2409 257/2 |
| 8,552,412 B2* | 10/2013 | Park | H01L 45/06 257/4 |
| 8,553,453 B2* | 10/2013 | Pellizzer | G11C 11/56 365/163 |
| 8,703,573 B2 | 4/2014 | Oh et al. | |
| 8,772,121 B2 | 7/2014 | Hwang et al. | |
| 8,785,213 B2 | 7/2014 | Oh et al. | |
| 8,829,590 B2* | 9/2014 | Park | H01L 45/1206 257/319 |
| 8,916,847 B2* | 12/2014 | Lee | H01L 45/04 257/3 |
| 9,196,827 B2 | 11/2015 | Oh et al. | |
| 9,431,610 B2 | 8/2016 | Park et al. | |
| 9,627,616 B2* | 4/2017 | Kim | H01L 45/1675 |
| 9,837,471 B2* | 12/2017 | Shepard | H01L 27/2427 |
| 9,837,604 B2* | 12/2017 | Liu | H01L 27/2463 |
| 9,978,810 B2* | 5/2018 | Pellizzer | H01L 45/04 |
| 10,109,679 B2* | 10/2018 | Chen | G11C 13/0069 |
| 10,134,470 B2* | 11/2018 | Tortorelli | G11C 13/004 |
| 10,147,763 B2* | 12/2018 | Pellizzer | H01L 27/2463 |
| 2005/0029627 A1* | 2/2005 | Dennison | H01L 27/2427 257/618 |
| 2007/0105267 A1* | 5/2007 | Karpov | H01L 45/06 438/95 |
| 2008/0203377 A1* | 8/2008 | Choi | H01L 45/085 257/5 |
| 2009/0166682 A1* | 7/2009 | Scheuerlein | B82Y 10/00 257/211 |
| 2009/0227067 A1* | 9/2009 | Kumar | H01L 45/04 438/104 |
| 2009/0321871 A1* | 12/2009 | Weng | H01L 21/76838 257/503 |
| 2009/0321878 A1* | 12/2009 | Koo | H01L 27/101 257/536 |
| 2010/0044778 A1* | 2/2010 | Seol | H01L 21/28273 257/326 |
| 2010/0163817 A1* | 7/2010 | Savransky | H01L 27/2427 257/2 |
| 2010/0270529 A1* | 10/2010 | Lung | G11C 13/0004 257/4 |
| 2011/0140068 A1* | 6/2011 | Ozawa | H01L 27/249 257/4 |
| 2011/0233644 A1* | 9/2011 | Fukuzumi | H01L 21/28282 257/324 |
| 2011/0299328 A1* | 12/2011 | Liu | G11C 5/025 365/163 |
| 2012/0001249 A1* | 1/2012 | Alsmeier | H01L 27/11551 257/319 |
| 2012/0032132 A1* | 2/2012 | Lee | H01L 27/2409 257/4 |
| 2012/0119179 A1* | 5/2012 | Nakao | B82Y 10/00 257/2 |
| 2012/0156848 A1* | 6/2012 | Yang | H01L 27/11529 438/287 |
| 2012/0211722 A1* | 8/2012 | Kellam | G11C 5/02 257/4 |
| 2012/0217564 A1* | 8/2012 | Tang | H01L 27/11524 257/315 |
| 2012/0261638 A1* | 10/2012 | Sills | H01L 27/2463 257/5 |
| 2012/0286226 A1* | 11/2012 | Seong | H01L 45/04 257/3 |
| 2013/0009122 A1* | 1/2013 | Park | H01L 27/2409 257/2 |
| 2013/0193398 A1* | 8/2013 | Pellizzer | H01L 27/2427 257/5 |
| 2013/0207068 A1* | 8/2013 | Pellizzer | H01L 45/06 257/5 |
| 2014/0124726 A1* | 5/2014 | Oh | H01L 45/144 257/4 |
| 2017/0117327 A1* | 4/2017 | Terai | H01L 27/2481 |
| 2017/0294483 A1* | 10/2017 | Terai | H01L 27/2427 |

* cited by examiner

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2016-0164249 filed on Dec. 5, 2016 in the Korean Intellectual Property Office, the disclosure of which is incorporated by reference herein in its entirety.

TECHNICAL FIELD

The present inventive concept relates to a semiconductor device and a method for fabricating the semiconductor device.

DISCUSSION OF THE RELATED ART

Generally, a semiconductor memory device is categorized as either a volatile memory device of which stored information is lost upon a loss of power, or a non-volatile memory device of which stored information is retained in the memory device even when there is a loss of power. An example of a non-volatile memory device is a flash memory device having a stacked gate structure. Meanwhile, a phase change memory device is a non-volatile memory device that is currently under development.

SUMMARY

According to an exemplary embodiment of the present inventive concept, a semiconductor device includes a first word line extending in a first direction, a first bit line extending in a second direction that intersects the first direction, wherein the first bit line and the first word line are spaced apart from each other in a third direction that intersects the first and second directions, a mold film disposed between the first word line and the first bit line, and a first memory cell disposed in the mold film. The first memory cell includes a first lower electrode in contact with the first word line, wherein side surfaces of the first lower electrode are in direct contact with the mold film, a first phase-change memory in contact with the first lower electrode, a first intermediate electrode in contact with the first phase-change memory, a first ovonic threshold switch (OTS) in contact with the first intermediate electrode, and a first upper electrode disposed between the first OTS and the first bit line, the first upper electrode in contact with the first OTS and the first bit line.

According to an exemplary embodiment of the present inventive concept, a semiconductor device, includes a first word line extending in a first direction, a second word line extending in the first direction and disposed on the first word line, wherein the second word line is parallel to the first word line, a first bit line extending in a second direction, which intersects the first direction, and disposed between the first and second word lines, a first memory cell disposed between the first word line and the first bit line. The first memory cell includes a first lower electrode disposed on the first word line, wherein the first lower electrode includes a first width extending in the first direction, a first phase-change memory disposed on the first lower electrode, wherein the first phase-change memory includes a second width that is greater than the first width, a first OTS disposed on the first phase-change memory, and a first upper electrode disposed between the first OTS and the first bit line. The semiconductor device further includes a second memory cell disposed between the second word line and the first bit line. The second memory cell includes a second lower electrode disposed on the first bit line, wherein the second lower electrode includes a third width extending in the second direction, a second phase-change memory disposed on the second lower electrode, wherein the second phase-change memory includes a fourth width that is greater than the third width, a second OTS disposed on the second phase-change memory, and a second upper electrode disposed between the second OTS and the second word line.

According to an exemplary embodiment of the present inventive concept, a semiconductor device including a first word line extending in a first direction, a first bit line extending in a second direction crossing the first direction, wherein the first bit line is disposed above the first word line, a first memory cell disposed on the first word line. The first memory cell includes core hole, wherein an inner mold film is disposed in the core hole, a first lower electrode disposed on the first word line and having a first height from an upper surface of the first word line, wherein the first lower electrode is in contact with the inner mold film, a first phase-change memory disposed on the first lower electrode at the first height, a first intermediate electrode disposed on the first phase-change memory, a first ovonic threshold switch (OTS) disposed on the first intermediate electrode, and a first upper electrode disposed on the first OTS. The semiconductor device further includes an outer mold film surrounding the first memory cell.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Exemplary embodiments of the present inventive concept will be described more fully hereinafter with reference to the accompanying drawings.

Hereinbelow, a semiconductor device according to exemplary embodiments of the present inventive concept will be described with reference to FIGS. 1 to 7.

Figure 1:
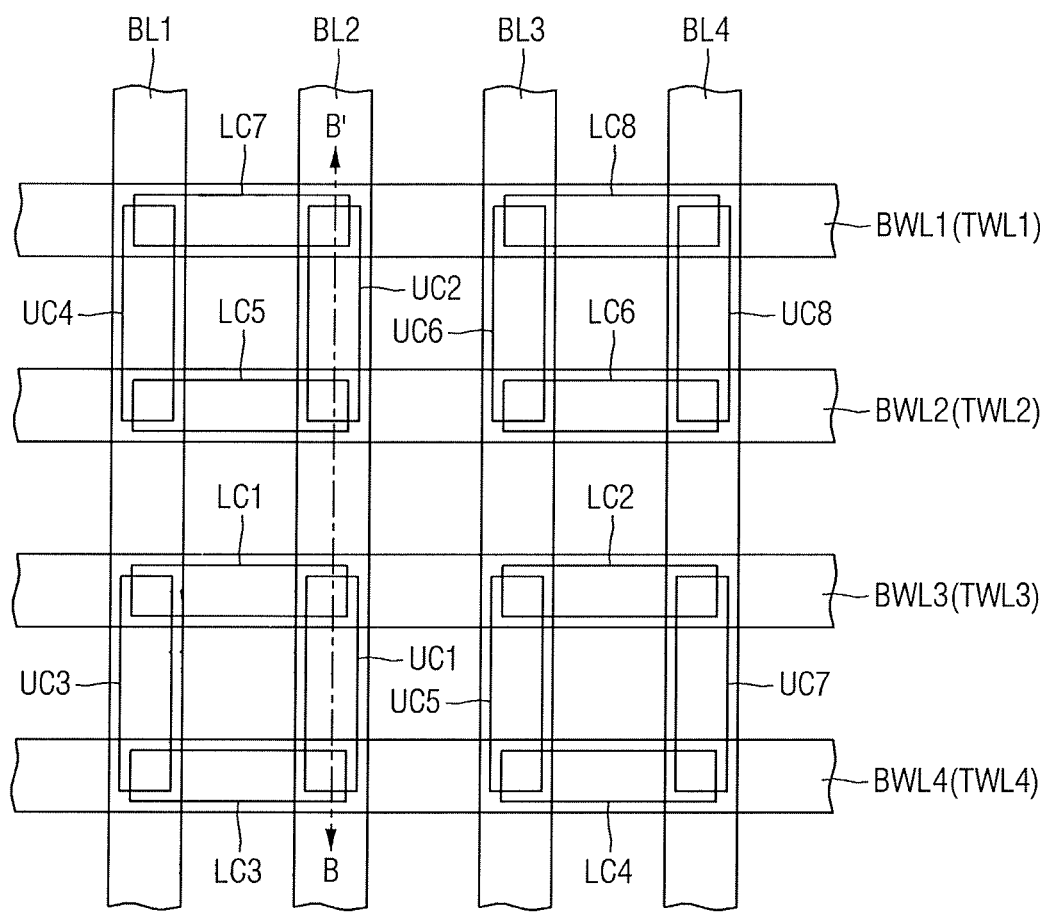
FIG. 1 is a layout diagram of a semiconductor device according to an exemplary embodiment of the present inventive concept.
Figure 1:
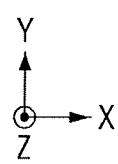
Figure 2:
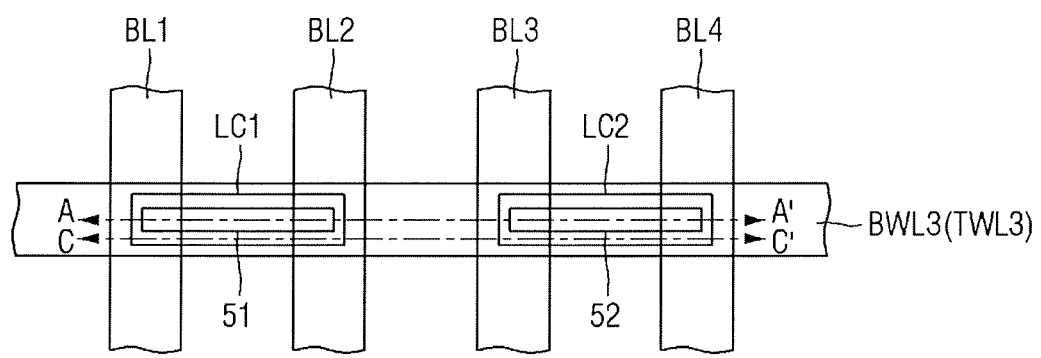
FIG. 2 is a layout diagram of a lower memory cell of FIG. 1.
Figure 2:
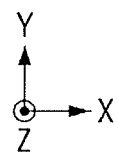
Figure 3:
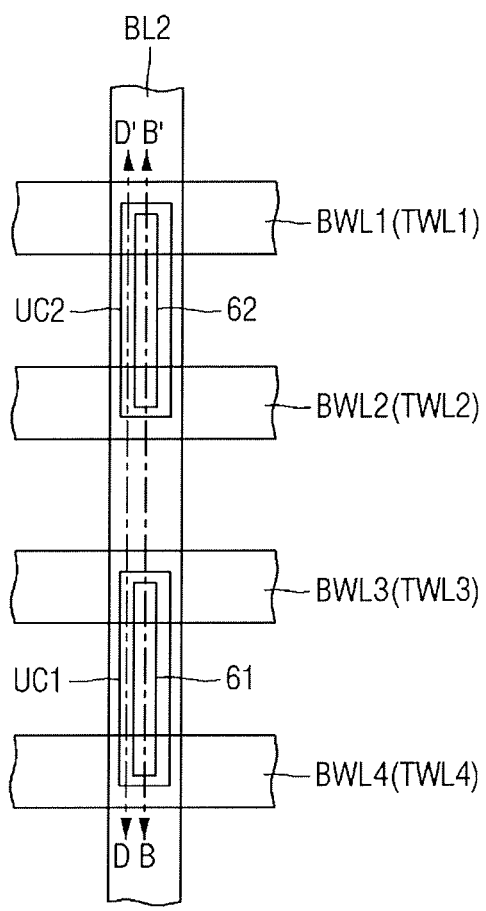
FIG. 3 is a layout diagram of an upper memory cell of FIG. 1.
Figure 4:
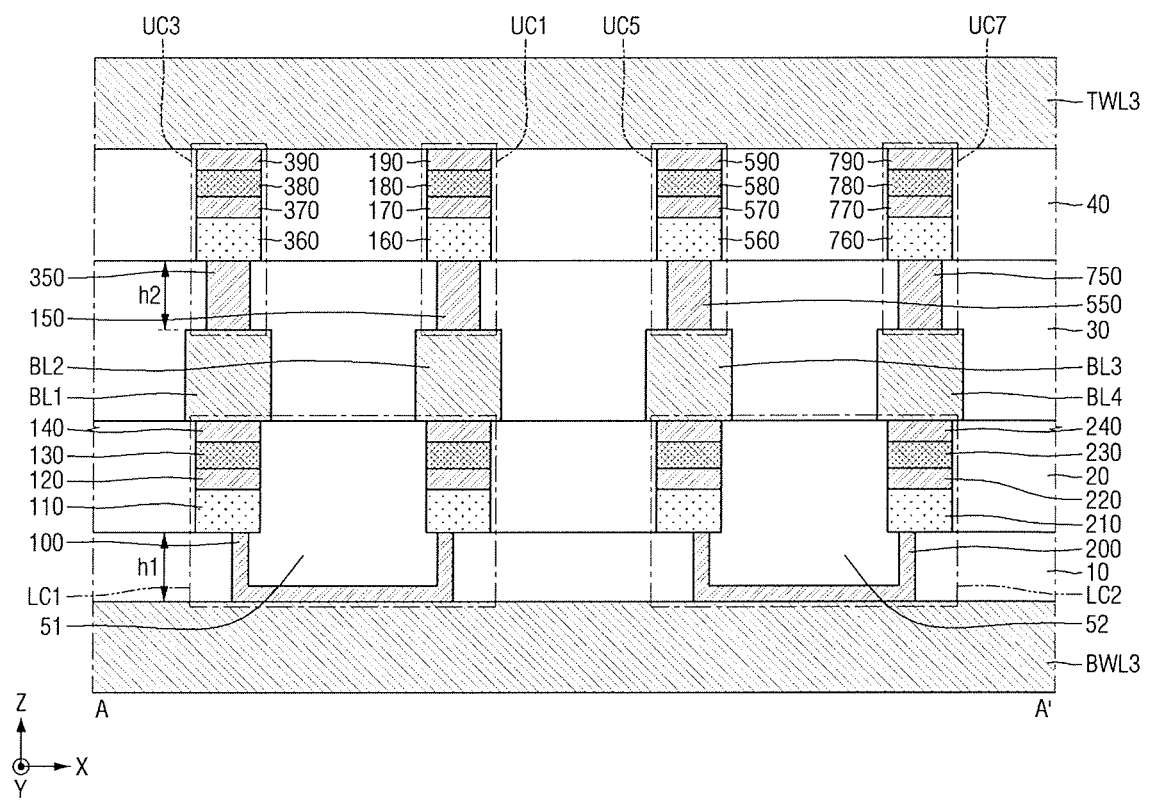
FIG. 4 is a cross sectional view of the semiconductor device taken on line A-A' of FIG. 2.
Figure 5:
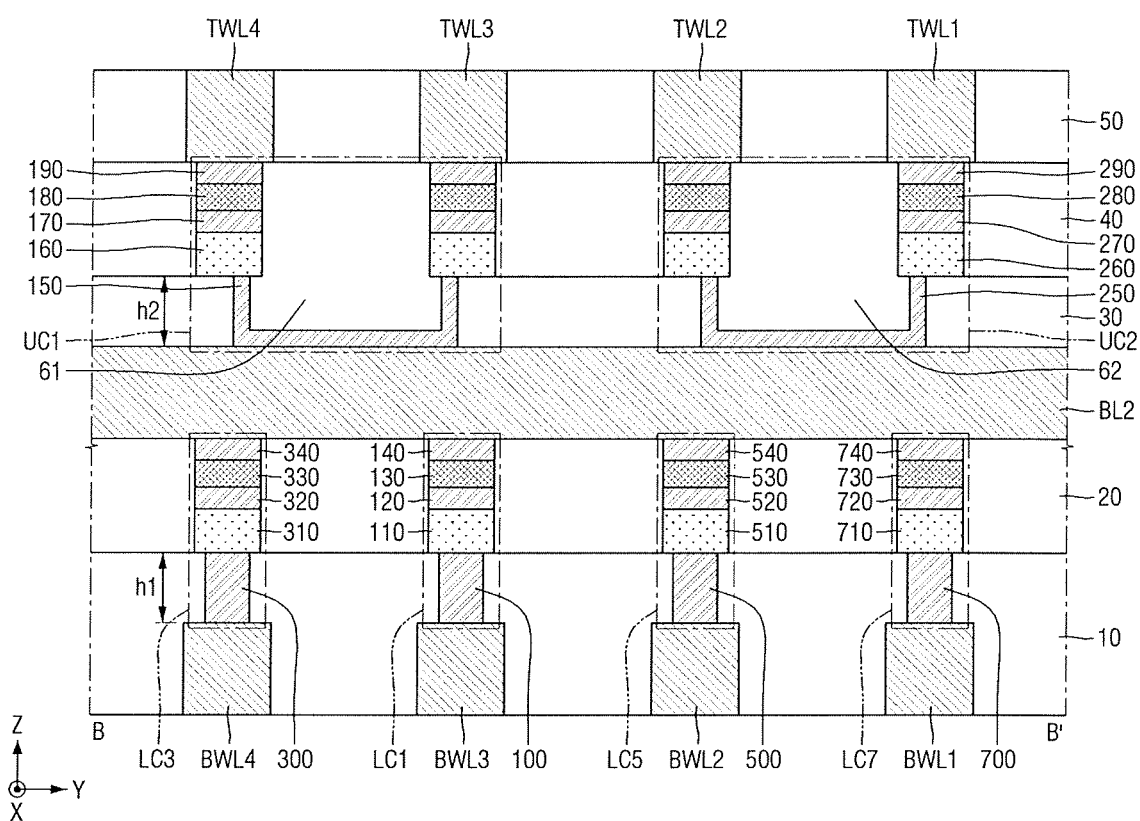
FIG. 5 is a cross sectional view of the semiconductor device taken on line B-B' of FIG. 3.
Figure 6:
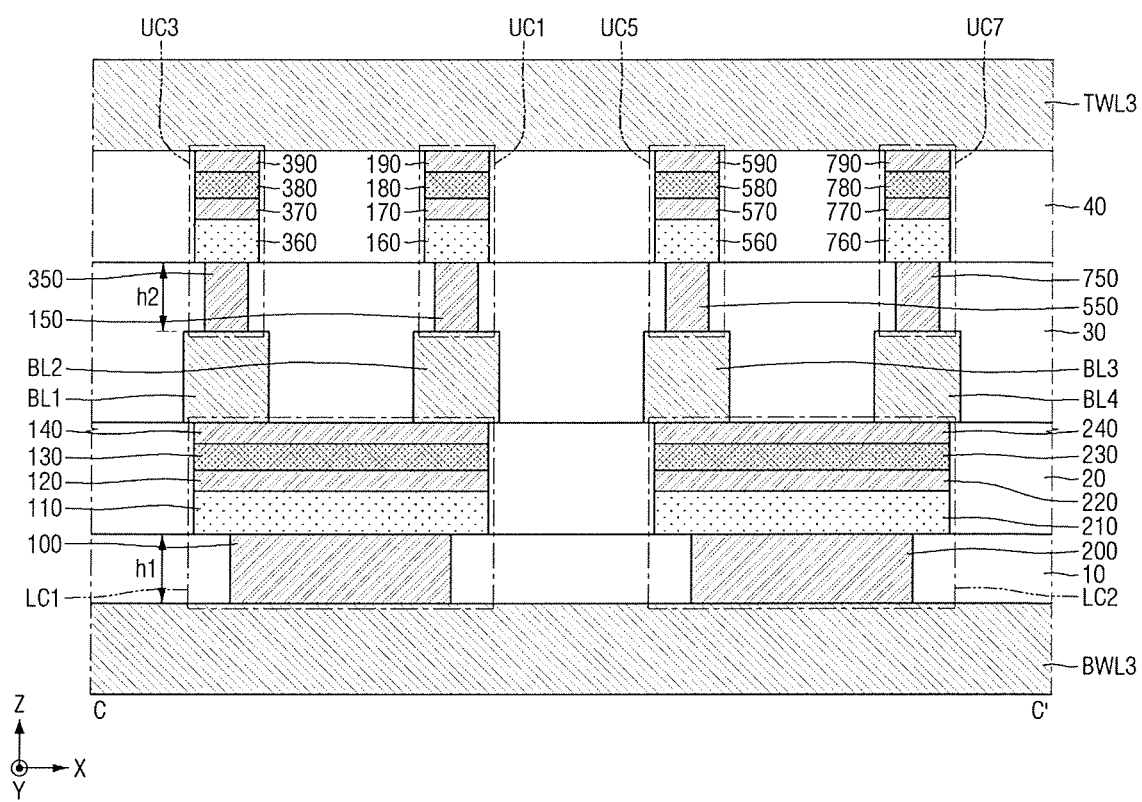
FIG. 6 is a cross sectional view of the semiconductor device taken on line C-C' of FIG. 2.
Figure 7:
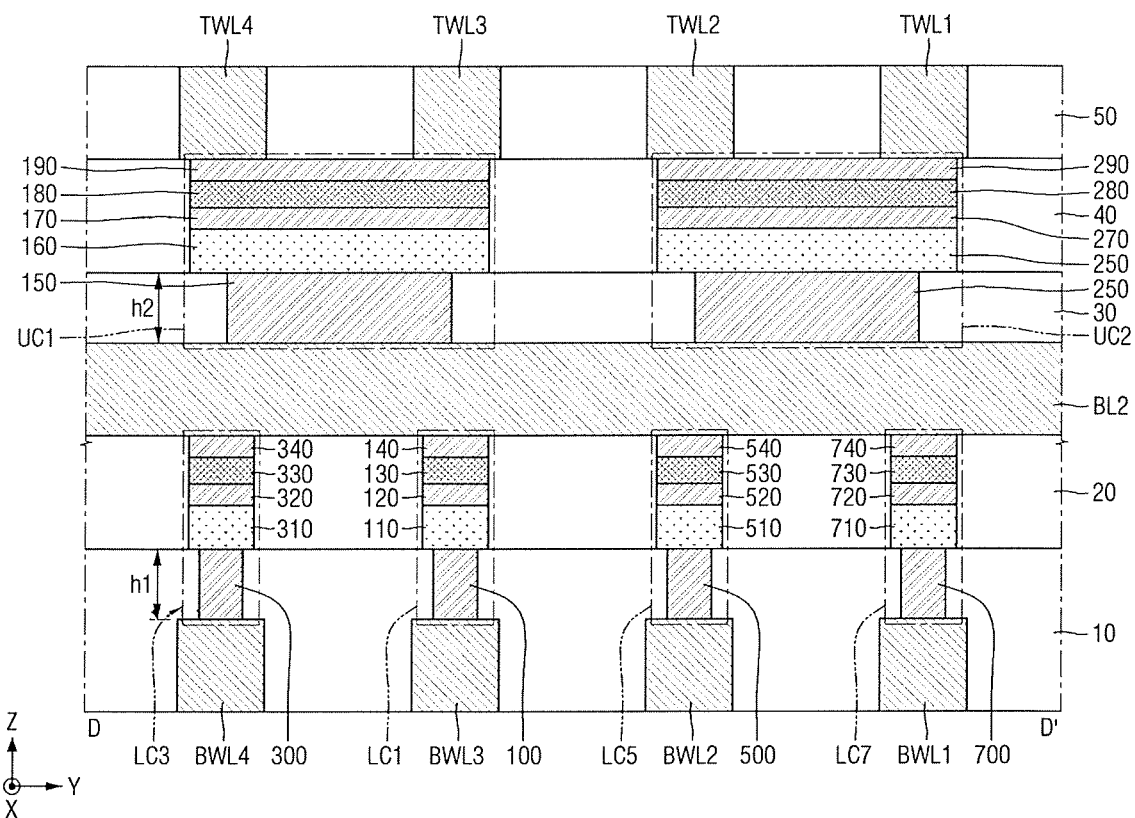
FIG. 7 is a cross sectional view of the semiconductor device taken on line D-D' of FIG. 3.

FIG. 1 is a layout diagram of a semiconductor device according to an exemplary embodiment of the present inventive concept, and FIG. 2 is a layout diagram of a lower memory cell of FIG. 1. FIG. 3 is a layout diagram of an upper memory cell of FIG. 1, and FIG. 4 is a cross sectional view of the semiconductor device taken on line A-A' of FIG. 2. FIG. 5 is a cross sectional view of the semiconductor device taken on line B-B' of FIG. 3, and FIG. 6 is a cross sectional view of the semiconductor device taken on line C-C' of FIG. 2. FIG. 7 is a cross sectional view of the semiconductor device taken on line D-D' of FIG. 3.

Referring to FIGS. 1 to 7, a semiconductor device according to an exemplary embodiment of the present inventive concept includes first to fourth lower word lines BWL1-BWL4, first to fourth upper word lines TWL1-TWL4, first to fourth bit lines BL1-BL4, first to eighth lower memory cells LC1-LC8, first to eighth upper memory cells UC1-UC8, and first to fifth mold films 10-50.

However, the elements described above are not limited to a specific number.

The first to fourth lower word lines BWL1-BWL4 may extend parallel to one another and in the first direction X. The first to fourth lower word lines BWL1-BWL4 may be spaced apart from each other in the second direction Y. The second direction Y crosses the first direction X. The first to fourth lower word lines BWL1-BWL4 may be formed parallel to one another and at a same height level as one another. For example, the second lower word line BWL2 may be positioned between the first lower word line BWL1 and the third lower word line BWL3, and the third lower word line BWL3 may be positioned between the second lower word line BWL2 and the fourth lower word line BWL4.

The first to fourth lower word lines BWL1-BWL4 may include a conductor. For example, the first to fourth lower word lines BWL1-BWL4 may include a metal, such as tungsten.

The first to fourth upper word lines TWL1-TWL4 may extend parallel to one another and in the first direction X. The first to fourth upper word lines TWL1-TWL4 may be spaced apart from each other in the second direction Y. The first to fourth upper word lines TWL1-TWL4 may be formed parallel to one another and at a same height level as one another.

For example, the second upper word line TWL2 may be positioned between the first upper word line TWL1 and the third upper word line TWL3, and the third upper word line TWL3 may be positioned between the second upper word line TWL2 and the fourth upper word line TWL4.

The first to fourth upper word lines TWL1-TWL4 may be formed at a higher level than the first to fourth lower word lines BWL1-BWL4. For example, the first to fourth upper word lines TWL1-TWL4 and the first to fourth lower word lines BWL1-BWL4 may be spaced apart from each other in the third direction Z, i.e., in the vertical direction or a stacked direction. The third direction Z crosses the first and second directions X and Y. The first to fourth upper word lines TWL1-TWL4 and the first to fourth lower word lines BWL1-BWL4 may respectively overlap each other in the third direction Z.

As illustrated in FIG. 1, the first to fourth upper word lines TWL1-TWL4 and the first to fourth lower word lines BWL1-BWL4 may be respectively disposed on each other in the third direction Z.

The first to fourth upper word lines TWL1-TWL4 may include a conductor. For example, the first to fourth upper word lines TWL1-TWL4 may include a metal such as tungsten.

The first to fourth bit lines BL1-BL4 may be formed between the first to fourth lower word lines BWL1-BWL4 and the first to fourth upper word lines TWL1-TWL4. The first to fourth bit lines BL1-BL4 may extend parallel to one another and in the second direction Y. For example, the first to fourth bit lines BL1-BL4 may be spaced apart from each other in the first direction X. Accordingly, the first to fourth lower word lines BWL1-BWL4 and the first to fourth upper word lines TWL1-TWL4 cross the first to fourth bit lines BL1-BL4 and, accordingly, form a mesh structure, when viewed from above.

For example, the second bit line BL2 may be positioned between the first bit line BL1 and the third bit line BL3, and the third bit line BL3 may be positioned between the second bit line BL2 and the fourth bit line BL4. The first to fourth bit lines BL1-BL4 may be formed at a location orthogonal to the first to fourth lower word lines BWL1-BWL4 and the first to fourth upper word lines TWL1-TWL4.

The first to fourth bit lines BL1-BL4 may include a conductor. For example, the first to fourth bit lines BL1-BL4 may include a metal such as tungsten.

The first to eighth lower memory cells LC1-LC8 may each be in contact with one of the first to fourth lower word lines BWL1-BWL4, and with two of the first to fourth bit lines BL1-BL4. For example, a lower surface of the first lower memory cell LC1 may be in contact with the third lower word line BWL3, and an upper surface of the first lower memory cell LC1 may be in contact with the first bit line BL1 and the second bit line BL2.

A lower surface of the second lower memory cell LC2 may be in contact with the third lower word line BWL3, and an upper surface of the second lower memory cell LC2 may be in contact with the third bit line BL3 and the fourth bit line BL4. The second lower memory cell LC2 is spaced apart from the first lower memory cell LC1. A lower surface of the third lower memory cell LC3 may be in contact with the fourth lower word line BWL4, and an upper surface of the third lower memory cell LC3 may be in contact with the first bit line BL1 and the second bit line BL2. A lower surface of the fourth lower memory cell LC4 may be in contact with the fourth lower word line BWL4, and an upper surface of the fourth lower memory cell LC4 may be in contact with the third bit line BL3 and the fourth bit line BL4.

Further, a lower surface of the fifth lower memory cell LC5 may be in contact with the second lower word line BWL2, and an upper surface of the fifth lower memory cell LC5 may be in contact with the first bit line BL1 and the second bit line BL2. A lower surface of the sixth lower memory cell LC6 may be in contact with the second lower word line BWL2, and an upper surface of the sixth lower memory cell LC6 may be in contact with the third bit line BL3 and the fourth bit line BL4.

A lower surface of the seventh lower memory cell LC7 may be in contact with the first lower word line BWL1, and an upper surface of the seventh lower memory cell LC7 may be in contact with the first bit line BL1 and the second bit line BL2. A lower surface of the eighth lower memory cell LC8 may be in contact with the first lower word line BWL1, and an upper surface of the eighth lower memory cell LC8 may be in contact with the third bit line BL3 and the fourth bit line BL4.

The first to eighth upper memory cells UC1-UC8 may each be in contact with one of the first to fourth bit lines BL1-BL4, and with two of the first to fourth upper word lines TWL1-TWL4. For example, a lower surface of the first upper memory cell UC1 may be in contact with the second bit line BL2, and an upper surface of the first upper memory cell UC1 may be in contact with the third upper word line TWL3 and the fourth upper word line TWL4. A lower surface of the second upper memory cell UC2 may be in contact with the second bit line BL2, and an upper surface of the second upper memory cell UC2 may be in contact with the first upper word line TWL1 and the second upper word line TWL2. The second upper memory cell UC2 is spaced apart from the first upper memory cell UC1.

A lower surface of the third upper memory cell UC3 may be in contact with the first bit line BL1, and an upper surface of the third upper memory cell UC3 may be in contact with the third upper word line TWL3 and the fourth upper word line TWL4. A lower surface of the fourth upper memory cell UC4 may be in contact with the first bit line BL1, and an upper surface of the fourth upper memory cell UC4 may be in contact with the first upper word line TWL1 and the second upper word line TWL2.

Further, a lower surface of the fifth upper memory cell UC5 may be in contact with the third bit line BL3, and an upper surface of the fifth upper memory cell UC5 may be in contact with the third upper word line TWL3 and the fourth upper word line TWL4. A lower surface of the sixth upper memory cell UC6 may be in contact with the third bit line BL3, and an upper surface of the sixth upper memory cell UC6 may be in contact with the first upper word line TWL1 and the second upper word line TWL2.

A lower surface of the seventh upper memory cell UC7 may be in contact with the fourth bit line BL4, and an upper surface of the seventh upper memory cell UC7 may be in contact with the third upper word line TWL3 and the fourth upper word line TWL4. A lower surface of the eighth upper memory cell UC8 may be in contact with the fourth bit line BL4, and an upper surface of the eighth upper memory cell UC8 may be in contact with the first upper word line TWL1 and the second upper word line TWL2.

FIG. 2 is a layout diagram illustrating the third lower word line BWL3 and the third upper word line TWL3, and the first lower memory cell LC1 and the second lower memory cell LC2, for convenience of explanation.

Referring to FIG. 2, the first lower memory cell LC1 and the second lower memory cell LC2 may each have a cylindrical shape and a first lower cell inner mold film 51 and a second lower cell inner mold film 52 therein, respectively. The cylindrical shape of the first lower memory cell LC1 may have a core hole in which the first lower cell inner mold film 51 is disposed, and the cylindrical shape of the second lower memory cell LC2 may have a core hole in which the second lower cell inner mold film 52 is disposed. In an example, a first lower cell lower electrode 100 and a second lower cell lower electrode 200, which will be described below, may each respectively separate lower surfaces of the first lower cell inner mold film 51 and the second lower cell inner mold film 52 from an upper surface of the third lower word line BWL3. In other words, the first lower cell lower electrode 100 may be disposed between the first lower cell inner mold film 51 and the third lower word line BWL3, and the second lower cell lower electrode 200 may be disposed between the second lower cell inner mold film 52 and the third lower word line BWL3. This will be explained in detail below.

The third to eighth lower memory cells LC3-LC8 may have the same structure as the first lower memory cell LC1 and the second lower memory cell LC2.

FIG. 3 is a layout diagram illustrating the second bit line BL2, and the first upper memory cell UC1 and the second upper memory cell UC2, for convenience of explanation.

Referring to FIG. 3, the first upper memory cell UC1 and the second upper memory cell UC2 may each have a cylindrical shape and a first upper cell inner mold film 61 and a second upper cell inner mold film 62 therein, respectively. The cylindrical shape of the first upper memory cell UC1 may have a core hole in which the first upper cell inner mold film 61 is disposed, and the cylindrical shape of the second upper memory cell UC2 may have a core hole in which the second upper cell inner mold film 62 is disposed. In an example, a first upper cell lower electrode 150 and a second upper cell lower electrode 250, which will be described below, may each respectively separate lower surfaces of the first upper cell inner mold film 61 and the second upper cell inner mold film 62 from an upper surface of the second bit line BL2. In other words, the first upper cell lower electrode 150 may be disposed between the first upper cell inner mold film 61 and the second bit line BL2, and the second upper cell lower electrode 250 may be disposed between the second upper cell inner mold film 62 and the second bit line BL2. This will be explained in detail below.

The third to eighth upper memory cells UC3-UC8 may have the same structure as the first upper memory cell UC1 and the second upper memory cell UC2.

Referring to FIGS. 1 to 7, the first lower memory cell LC1 includes the first lower cell lower electrode 100, a first lower cell phase-change memory 110, a first lower cell intermediate electrode 120 (e.g., 220, 320, 520 and 720), a first lower cell ovonic threshold switch (OTS) 130 (e.g., 230, 330, 530 and 730), a first lower cell upper electrode 140 (e.g., 240, 340, 540 and 740), and the first lower cell inner mold film 51.

The first lower cell lower electrode 100 may be formed on an upper surface of the third lower word line BWL3. For example, the first lower cell lower electrode 100 may be in direct contact with the third lower word line BWL3. The first lower cell lower electrode 100 may be positioned at a lowest portion of the first lower memory cell LC1, and the lower surface of the first lower cell lower electrode 100 may be the lower surface of the first lower memory cell LC1. For example, the first lower cell lower electrode 100 may have a "U-like shape" from a cross-sectional view.

The first lower cell lower electrode 100 may include a conductor. For example, the first lower cell lower electrode 100 may include at least one of W, Ti, Al, Cu, C, CN, TiN, TiAlN, TiSiN, TiCN, WN, CoSiN, wSiN, TaN, TaCN, and TaSiN. In addition to the first lower cell intermediate electrode 120 and the first lower cell upper electrode 140 described below, the first lower cell lower electrode 100 may also serve as a heater to apply heat to the first lower cell phase-change memory 110.

The first lower cell phase-change memory 110 may be positioned on the first lower cell lower electrode 100. The first lower cell phase-change memory 110 may include a phase-change material. The first lower cell phase-change memory 110 may be composed of various types of materials including, for example, a compound combining two atoms such as GaSb, InSb, InSe, SbTe, GeTe, a compound combining three atoms such as GeSbTe, GeBiTe, GaSeTe, InSbTe, SnSb2Te4, InSbGe, a compound combining four atoms such as AgInSbTe, (GeSn)SbTe, GeSb(SeTe), $Te_{81}Ge_{15}Sb_2S_2$, and so on. Further, the materials mentioned above may be doped with nitrogen (N), silicon (Si), carbon (C), or oxygen (O). For example, GeSbTe doped with nitrogen (N), silicon (Si), carbon (C) or oxygen (O) may be included in the first lower cell phase-change memory 110.

The first lower cell phase-change memory 110 may be present in a crystalline, an amorphous, or a melted state in response to the heat generated by the first lower cell lower electrode 100, the first lower cell intermediate electrode 120, and the first lower cell upper electrode 140. Further, the first lower cell phase-change memory 110 may store information according to such state as previously discussed.

The first lower cell intermediate electrode 120 may be formed on the first lower cell phase-change memory 110. In addition to the first lower cell lower electrode 100 described above and the first lower cell upper electrode 140 to be described below, the first lower cell intermediate electrode 120 may also serve to apply heat to the first lower cell phase-change memory 110.

The first lower cell intermediate electrode 120 may include a conductor. For example, the first lower cell intermediate electrode 120 may include at least one of W, Ti, Al, Cu, C, CN, TiN, TiAlN, TiSiN, TiCN, WN, CoSiN, WSiN, TaN, TaCN, and TaSiN.

The first lower cell OTS 130 may be formed on the first lower cell intermediate electrode 120. The first lower cell OTS 130 may include chalcogenide. The first lower cell OTS 130 may switch the state of the first lower cell phase-change memory 110 described above into either an amorphous ("on") state or a crystalline ("off") state. The first lower cell OTS 130 may cause the first lower cell phase-change memory 110 to change its state thereof according to a voltage applied to the first lower cell phase-change memory 110. Accordingly, it may act as a switch of the memory.

The first lower cell OTS 130 may switch the state of the first lower cell phase-change memory 110 according to whether or not the current passing the first lower cell OTS 130 exceeds a threshold current, or whether or not the voltage applied to the first lower cell OTS 130 exceeds a threshold voltage.

The first lower cell upper electrode 140 may be formed on the first lower cell OTS 130. In addition to the first lower cell lower electrode 100 and the first lower cell intermediate electrode 120 described above, the first lower cell upper electrode 140 may serve to apply heat to the first lower cell phase-change memory 110.

A semiconductor device according to an exemplary embodiment of the present inventive concept may configure the first lower memory cell LC1 with the first lower cell lower electrode 100 and the first lower cell upper electrode 140 only. For example, the first lower cell lower electrode 100 and the first lower cell upper electrode 140 may apply heat to the first lower cell phase-change memory 110. The first lower cell intermediate electrode 120 may be added to further increase the heating efficiency and speed up the memory operation.

The first lower cell LC1 has a cylindrical shape whose interior is filled with the first lower cell inner mold film 51. For example, the first lower cell lower electrode 100, the first lower cell phase-change memory 110, first lower cell intermediate electrode 120, first lower cell OTS 130 and the first lower cell upper electrode 140 surround the first lower inner mold film 51. As an additional example, a bottom surface of the first lower memory cell LC1 may be the first lower cell lower electrode 100, and a sidewall of the first lower memory cell LC1 may be a stacked structure in which the first lower cell lower electrode 100, the first lower cell phase-change memory 110, the first lower cell intermediate electrode 120, the first lower cell OTS 130, and the first lower cell upper electrode 140 are layered in order. For example, the first lower cell inner mold film 51 may be surrounded by the sidewall.

The second lower cell lower electrode 200 may be formed on an upper surface of the third lower word line BWL3. The second lower memory cell LC2 may have the same structure as that of the first lower memory cell LC1. For example, the first lower cell lower electrode 100, the first lower cell phase-change memory 110, the first lower cell intermediate electrode 120, the first lower cell OTS 130, the first lower cell upper electrode 140, and the first lower cell inner mold film 51 may correspond to the second lower cell lower electrode 200, the second lower cell phase-change memory 210, the second lower cell intermediate electrode 220, the second lower cell OTS 230, the second lower cell upper electrode 240, and the second lower cell inner mold film 52, respectively.

Each of the third to eighth lower memory cells LC3-LC8 may have the same structure as that of the first lower memory cell LC1.

In an example, a height of the upper surfaces of the first through third, fifth and seventh lower cell lower electrodes 100-300, 500 and 700 may be the same as a first height h1. In addition, the lower surfaces of the first through third, fifth and seventh lower cell phase-change memories 110-310, 510 and 710 may all have the same height as the first height h1.

In an example, the widths of the first lower cell phase-change memory 110, the first lower cell intermediate electrode 120, the first lower cell OTS 130, and the first lower cell upper electrode 140 may all be identical, and the widths extend in the first direction X. This is due to the fact that the first lower cell phase-change memory 110, the first lower cell intermediate electrode 120, the first lower cell OTS 130, and the first lower cell upper electrode 140 are formed sequentially in a hole, which is formed by one single process. This feature may also be provided in the second to eighth lower memory cells LC2-LC8.

Further, the width of the first lower cell lower electrode 100 may be less than the widths, in the first direction X, of the first lower cell phase-change memory 110, the first lower cell intermediate electrode 120, the first lower cell OTS 130, and the first lower cell upper electrode 140.

The first, second, third, fourth and fifth mold films 10, 20, 30, 40 and 50 may each be disposed between the first to fourth lower word lines BWL1-BWL4 and the first to fourth upper word lines TWL1-TWL4, respectively. Further, the first to fifth mold films 10-50 may surround the first to fourth bit lines BL1-BL4, the first to eighth lower memory cells LC1-LC8, and the first to eighth upper memory cells UC1-UC8.

In an example, the first to fifth mold films 10-50 may be one of SiN, $SiO_2$ and Si.

An outer side surface of the first lower cell lower electrode 100 may be surrounded by the first mold film 10, and may be in direct contact with the first mold film 10. An inner side surface of the first lower cell lower electrode 100 may be in direct contact with the first lower cell inner mold film 51. This feature may also be provided in the second to eighth lower memory cells LC2-LC8.

The first through third, fifth and seventh lower cell lower electrodes 100-300, 500 and 700 of a semiconductor device according to an exemplary embodiment of the present inventive concept may be in direct contact with the first mold film 10 without having a spacer therebetween. In an example, when the first mold film 10 is SiN, interface oxidation might not occur even when heat is applied from the heating of the first through third, fifth and seventh lower cell lower electrodes 100-300, 500 and 700 so that the semiconductor device may have an increased thermal endurance.

Further, in a comparative example, a related structure that includes a silicon dioxide (SiO$_2$) spacer on side surfaces of the first through third, fifth and seventh lower cell lower electrodes 100-300, 500 and 700 might not only have the problem associated with interface oxidation during heating, but may also have a problem of the first through third, fifth and seventh lower cell phase-change memories 110-310, 510 and 710 in a melted (e.g., a liquid) state flowing down between the spacer and each of the first through third, fifth and seventh lower cell lower electrodes 100-300, 500 and 700.

Conversely, a semiconductor device according to an exemplary embodiment of the present inventive concept has the first through third, fifth and seventh lower cell lower electrodes 100-300, 500 and 700 in direct contact with the first mold film 10 and does not have heterogeneous interfaces. Accordingly, the problem of the first through third, fifth and seventh lower cell phase-change memories 110-310, 510 and 710 in the melted state may be prevented from flowing down between the spacer and the first through third, fifth and seventh lower cell lower electrodes 100-300, 500 and 700, and the semiconductor device may have increased reliability.

Moreover, in the semiconductor device according to an exemplary embodiment of the present inventive concept, the first through third, fifth and seventh lower memory cells LC1-LC3, LC5 and LC7 may have the first through third, fifth and seventh lower cell lower electrodes 100-300, 500 and 700 all at the same height as the first height h1. In addition, the fourth, sixth and eighth lower memory cells LC4, LC6 and LC8 have the same structure as the that of first through third, fifth and seventh lower memory cells LC1-LC3, LC5 and LC7. This is attributable to a fabricating method that uses sacrificial film on the first mold film 10, which will be described below.

When the heights of the first through third, fifth and seventh lower cell lower electrodes 100-300, 500 and 700 are all identical, the first through third, fifth and seventh lower memory cells LC1-LC3, LC5 and LC7 may have the same current value (Ireset) being applied.

The heights of the first through third, fifth and seventh lower cell lower electrodes 100-300, 500 and 700 and the heights of the first through third, fifth and seventh lower cell phase-change memories 110-310, 510 and 710 may be factors associated with heat dissipation. Considering that the current value (Ireset) varies depending on an amount of heat dissipation, the heights of the first through third, fifth and seventh lower cell lower electrodes 100-300, 500 and 700 and the heights of the first through third, fifth and seventh lower cell phase-change memories 110-310, 510 and 710 have to be identical to each other in the first through third, fifth and seventh lower memory cells LC1-LC3, LC5 and LC7. For example, the height of the upper surface of first lower cell lower electrode 100 is the same as that of the lower surface of the first lower cell phase-change memory 110. In addition, the fourth, sixth and eighth lower memory cells LC4, LC6 and LC8 have the same structure as the first through third, fifth and seventh lower memory cells LC1-LC3, LC5 and LC7.

For example, the reduced structural differences among memory cells may provide reduced current distributions such that a plurality of memory cells may perform the same operation with substantially the same current. As a result, the semiconductor device may have increased overall reliability.

The first upper cell lower electrode 150 may be formed on an upper surface of the second bit line BL2. The first upper memory cell UC1 may have the same structure as the first lower memory cell LC1. For example, the first lower cell lower electrode 100, the first lower cell phase-change memory 110, the first lower cell intermediate electrode 120, the first lower cell OTS 130, the first lower cell upper electrode 140, and the first lower cell inner mold film 51 may correspond to the first upper cell lower electrode 150, the first upper cell phase-change memory 160, the first upper cell intermediate electrode 170 (e.g., 270, 370, 570 and 770), the first upper cell OTS 180 (e.g., 280, 380, 580 and 780), the first upper cell upper electrode 190 (e.g., 290, 390, 590 and 790), and the first upper cell inner mold film 61, respectively. As an additional example, the first height h1 of the first lower memory cell LC1 may be substantially the same as a second height h2 of the first upper memory cell UC1, which will be discussed later.

This structural feature may be provided in the second to eighth upper memory cells UC2-UC8.

The direction in which the first to eighth lower memory cells LC1-LC8 extend is the first direction X, and the direction in which the first to eighth upper memory cells UC1-UC8 extend is the second direction Y. For example, for a memory cell having a rectangular cross section and long sides and short sides, the "direction of extension" may by represented by a direction in which the long sides extend.

Accordingly, the first to eighth upper memory cells UC1-UC8 may have the same structure as that of the first to eighth lower memory cells LC1-LC8, but may extend in different directions of extension and may even have different vertical levels (e.g., layers). For example, the vertical levels of the first to eighth upper memory cells UC1-UC8 may be disposed between the first through fourth bit lines BL1-BL4 and the first through fourth upper word lines TWL1-TWL4, while the vertical levels of the first to eighth lower memory cells LC1-LC8 may be disposed between the first through fourth bit lines BL1-BL4 and the first through fourth lower word lines BWL1-BWL4.

An outer side surface of the first upper cell lower electrode 150 may be surrounded by the third mold film 30, and may be in direct contact with the third mold film 30. An inner side surface of the first upper cell lower electrode 150 may be in direct contact with the first upper cell inner mold film 61. This feature may be provided in the second to eighth upper memory cells UC2-UC8.

The first through third, fifth and seventh upper cell lower electrodes 150-350, 550 and 750 of a semiconductor device, according to an exemplary embodiment of the present inventive concept, may be in direct contact with the third mold film 30 without having a spacer disposed therebetween. In an example, when the third mold film 30 is SiN, interface oxidation might not occur even when the heat is applied from the heating of the first through third, fifth and seventh upper cell lower electrodes 150-350, 550 and 750 so that the semiconductor device may have an increased thermal endurance.

Further, in a comparative example, a related structure that includes a SiO$_2$ spacer on side surfaces of the first through third, fifth and seventh upper cell lower electrodes 150-350, 550 and 750 might not only have the problem associated with interface oxidation during heating, but may also have a problem of the first through third, fifth and seventh upper cell phase-change memories 160-360, 560 and 760 in a melted state flowing down between the spacer and each of first through third, fifth and seventh upper cell lower electrodes 150-350, 550 and 750.

Conversely, a semiconductor device according to an exemplary embodiment of the present inventive concept has the first through third, fifth and seventh upper cell lower electrodes 150-350, 550 and 750 in direct contact with the third mold film 30 and does not have heterogeneous interfaces. Accordingly, the problem of the first through third, fifth and seventh upper cell phase-change memories 160-360, 560 and 760 in the melted state may be prevented from flowing down between the spacer and the first through third, fifth and seventh upper cell lower electrodes 150-350, 550 and 750, and accordingly, the semiconductor device may have increased reliability.

Moreover, in the semiconductor device according to an exemplary embodiment of the present inventive concept, the first through third, fifth and seventh upper memory cells UC1-UC3, UC5 and UC7 may have the first through third, fifth and seventh upper cell lower electrodes 150-350, 550 and 750 all at the same height as the second height h2 from an upper surface of the first to fourth bit lines BL1-BL4. In addition, the fourth, sixth and eighth upper memory cells UC4, UC6 and UC8 have the same structure as the first through third, fifth and seventh upper memory cells UC1-UC3, UC5 and UC7. This is attributable to a fabricating method that uses sacrificial film on the third mold film 30, which will be described below.

When the heights of the first through third, fifth and seventh upper cell lower electrodes 150-350, 550 and 750 are all identical, the first through third, fifth and seventh upper memory cells UC1-UC3, UC5 and UC7 may have the same current value (Ireset) being applied.

The heights of the first through third, fifth and seventh upper cell lower electrodes 150-350, 550 and 750 and the heights of the first through third, fifth and seventh upper cell phase-change memories 160-360, 560 and 760 may be factors associated with heat dissipation. Considering that the current value (Ireset) varies depending on an amount of the heat dissipation, the heights of the first through third, fifth and seventh upper cell lower electrodes 150-350, 550 and 750 and the heights of the first through third, fifth and seventh upper cell phase-change memories 160-360, 560 and 760 have to be identical to each other in the first through third, fifth and seventh upper memory cells UC1-UC3, UC5 and UC7. For example, the height of the upper surface of first upper cell lower electrode 150 is the same as that of the lower surface of the first upper cell phase-change memory 160.

For example, the reduced structural differences among the memory cells may provide reduced current distributions such that the memory cells may perform the same operation with substantially the same current. As a result, the semiconductor device may have increased overall reliability.

Hereinbelow, the semiconductor device according to an exemplary embodiment of the present inventive concept will be described with reference to FIGS. 8 to 10. Elements or operations that may be assumed to be the same as or similar to exemplary embodiments of the present inventive concept described above, will be mentioned as briefly as possible or omitted for the sake of brevity.

Figure 8:
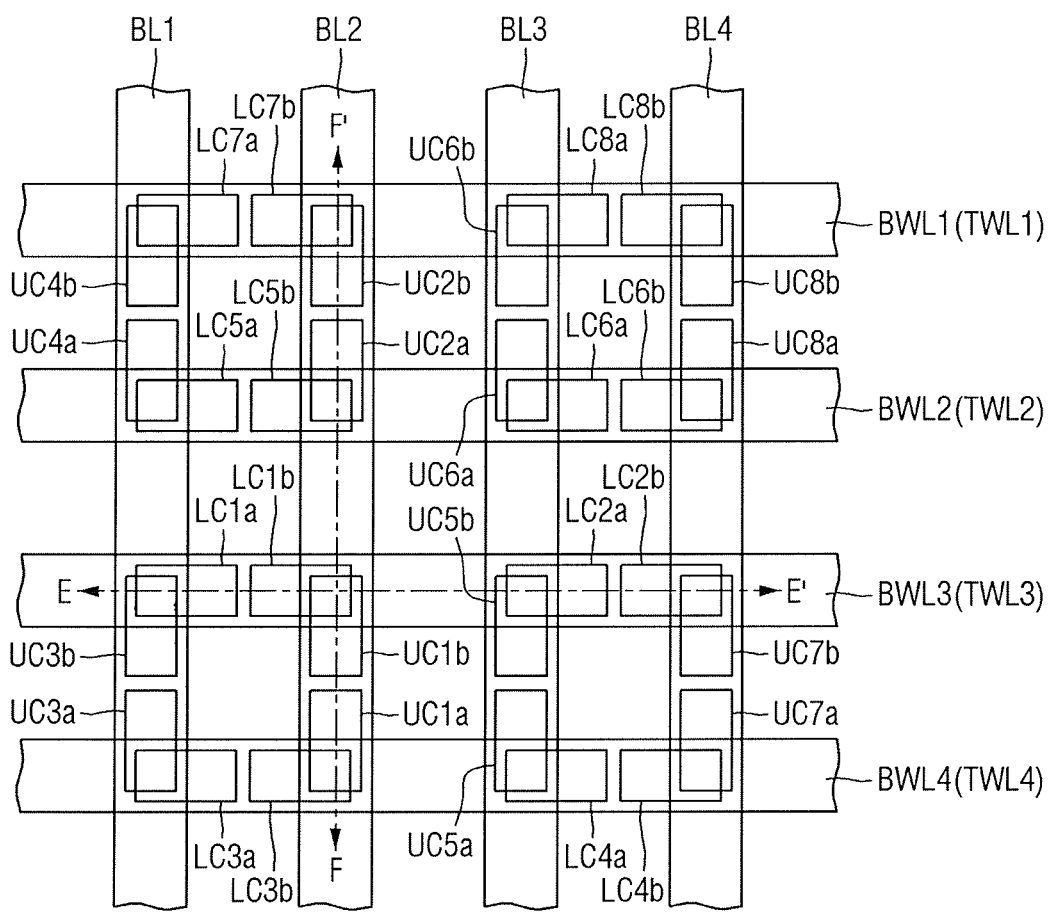
FIG. 8 is a layout diagram of a semiconductor device according to an exemplary embodiment of the present inventive concept.
Figure 9:
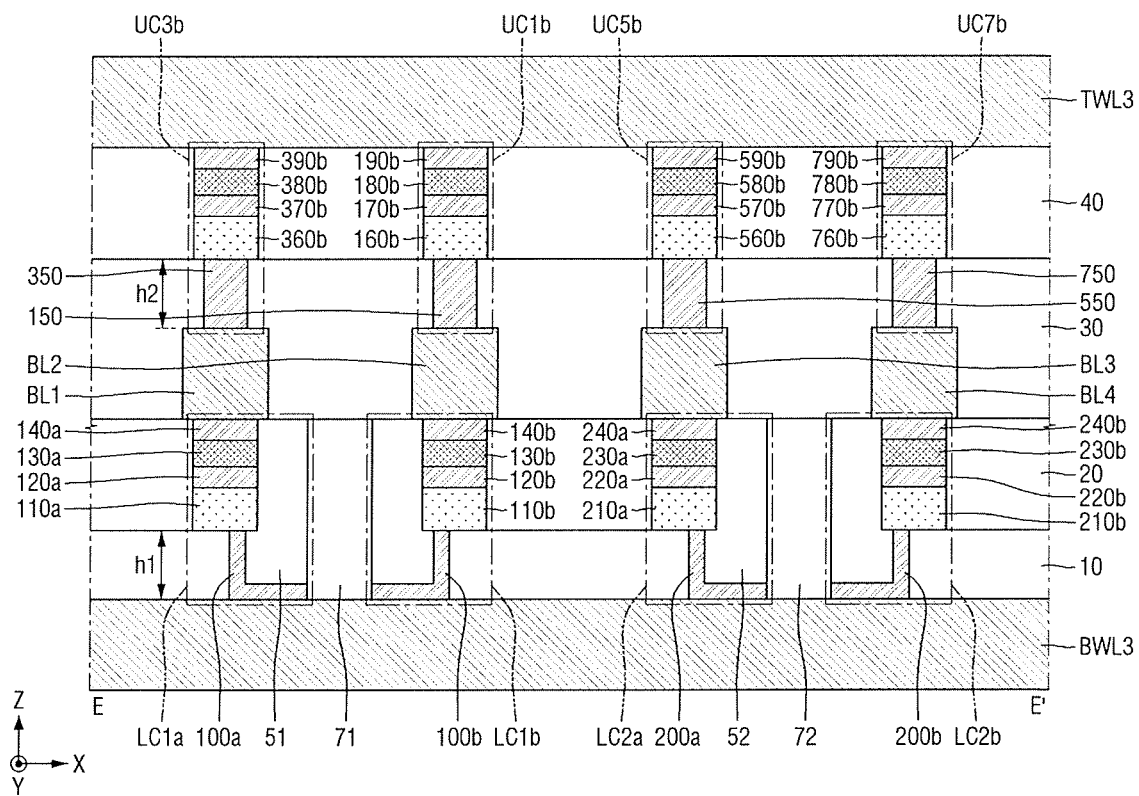
FIG. 9 is a cross sectional view of the semiconductor device taken on line E-E' of FIG. 8.

FIG. 8 is a layout diagram of a semiconductor device according to an exemplary embodiment of the present inventive concept, and FIG. 9 is a cross sectional view of the semiconductor device taken on line E-E' of FIG. 8. FIG. 10 is a cross sectional view of the semiconductor device taken on line F-F' of FIG. 8.

Figure 10:
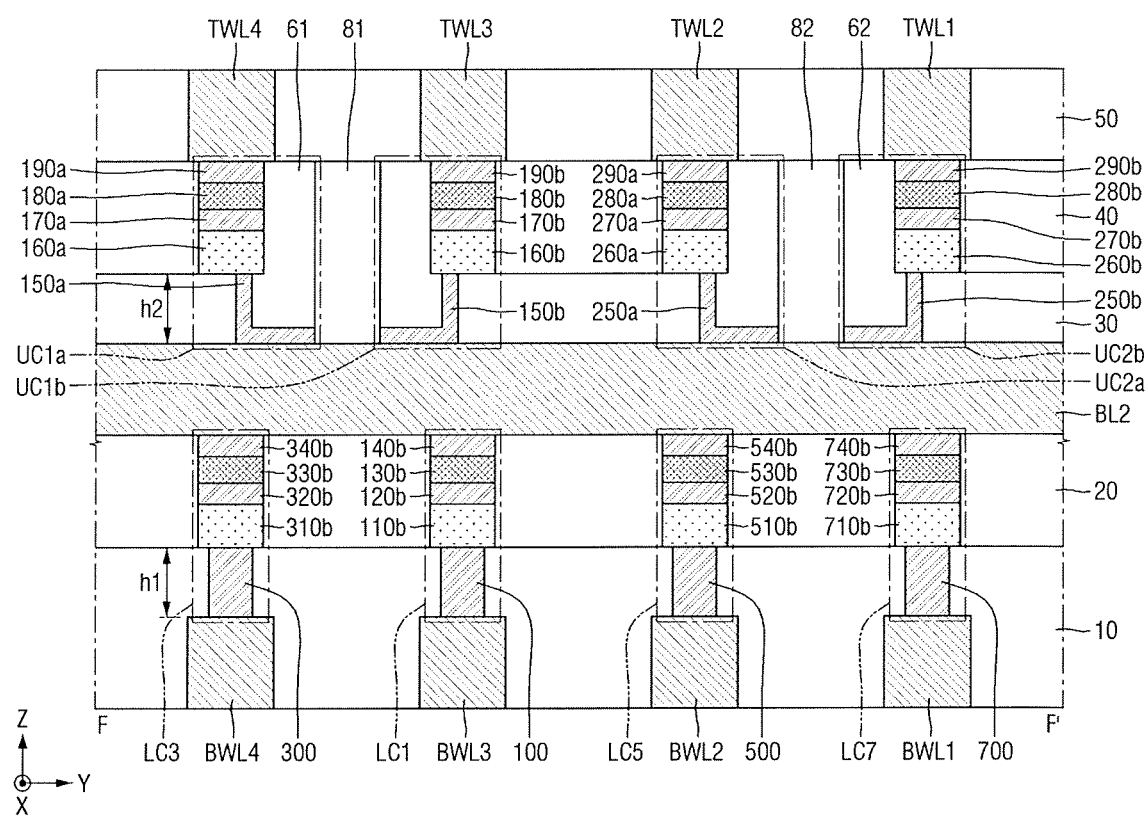
FIG. 10 is a cross sectional view of the semiconductor device taken on line F-F' of FIG. 8.

Referring to FIGS. 8 to 10, a semiconductor device according to an exemplary embodiment of the present inventive concept having the first to eighth lower memory cells LC1-LC8 and the first to eighth upper memory cells UC1-UC8 of the previous exemplary embodiments shown in FIGS. 1 through 7, which are each divided into two cells, respectively. Accordingly, the first to eighth lower memory cells LC1-LC8 may each be divided into first-first, second-first, third-first, fourth-first, fifth-first, sixth-first, seventh-first and eighth-first lower memory cells LC1a, LC2a, LC3a, LC4a, LC5a, LC6a, LC7a and LC8a and first-second, second-second, third-second, fourth-second, fifth-second, sixth-second, seventh-second and eighth-second lower memory cells LC1b, LC2b, LC3b, LC4b, LC5b, LC6b, LC7b and LC8b, and the first to eighth upper memory cells UC1-UC8 may each be divided into first-first, second-first, third-first, fourth-first, fifth-first, sixth-first, seventh-first and eighth-first upper memory cells UC1a, UC2a, UC3a, UC4a, UC5a, UC6a, UC7a and UC8a and first-second, second-second, third-second, fourth-second, fifth-second, sixth-second, seventh-second and eighth-second upper memory cells UC1b, UC2b, UC3b, UC4b, UC5b, UC6b, UC7b and UC8b.

The first lower memory cell LC1 may be divided by the first lower cell separator 71 (e.g., 72, 81, and 82). The first lower cell separator 71 may divide the first lower memory cell LC1 into a first-first lower memory cell LC1a and first-second lower memory cell LC1b. The first lower cell separator 71 may be an insulating film that includes one of, for example, a silicon nitride film, a silicon oxide film, and a silicon oxynitride film.

Accordingly, the first-first lower memory cell LC1a may include the first-first lower cell lower electrode 100a (e.g., 200a), the first-first lower cell phase-change memory 110a (e.g., 210a), the first-first lower cell intermediate electrode 120a (e.g., 220a), the first-first lower cell OTS 130a (e.g., 230a), and the first-first lower cell upper electrode 140a (e.g., 240a). The first-second lower memory cell LC1b may include the first-second lower cell lower electrode 100b (e.g., 200b), the first-second lower cell phase-change memory 110b (e.g., 210b, 310b, 510b, 710b), the first-second lower cell intermediate electrode 120b (e.g., 220b, 320b, 520b, 720b), the first-second lower cell OTS 130b (e.g., 230b, 330b, 530b, 730b), and the first-second lower cell upper electrode 140b (e.g., 240b, 340b, 540b, 740b).

The second lower memory cell LC2 may be divided by the second lower cell separator 72 into a second-first lower memory cell LC2a and a second-second lower memory cell LC2b the same as the first lower memory cell LC1. Further, other lower memory cells may also be divided by the separators.

In addition, the first-first upper memory cell UC1a may include the first-first upper cell lower electrode 150a (e.g., 250a), the first-first upper cell phase-change memory 160a (e.g., 260a), the first-first upper cell intermediate electrode 170a (e.g., 270a), the first-first upper cell OTS 180a (e.g., 280a), and the first-first upper cell upper electrode 190a (e.g., 290a). The first-second upper memory cell UC1b may include the first-second upper cell lower electrode 150b (e.g., 250b), the first-second upper cell phase-change memory 160b (e.g., 260b, 360b, 560b, 760b), the first-second upper cell intermediate electrode 170b (e.g., 270b, 370b, 570b, 770b), the first-second upper cell OTS 180b (e.g., 280b, 380b, 580b, 780b), and the first-second upper cell upper electrode 190b (e.g., 290b, 390b, 590b, 790b).

Further, the second-first to eighth-first lower memory cells LC2a-LC8a and the second-second to eighth-second lower memory cells LC2b-LC8b, and the second-first to eighth-first upper memory cells UC2a-UC8a and the second-second to eighth-second upper memory cells UC2b-UC8b have the same structure as the first-first lower memory cell LC1a and first-second lower memory cell LC1b and the first-first upper memory cell UC1a and first-second upper memory cell UC1b, respectively.

A semiconductor device according to an exemplary embodiment of the present inventive concept may have two times greater integration density of memory cells, since the memory cells formed together are divided into two memory cells. Accordingly, the overall capacity of the memory cells may be increased, and the fabrication cost for the semiconductor device may be reduced.

Hereinbelow, a method for fabricating a semiconductor device according to an exemplary embodiment will be explained with reference to FIGS. 4, and 11 to 24. Elements or operations that may be assumed to be the same as or similar to exemplary embodiments of the present inventive concept described above, will be mentioned as briefly as possible or omitted for the sake of brevity.

FIGS. 11 to 24 are views illustrating stages of a method for fabricating a semiconductor device according to an exemplary embodiment of the present inventive concept. FIGS. 11 to 24 may be illustrations corresponding to cross sections of the semiconductor device taken along line A-A' of FIG. 2.

Figure 11:
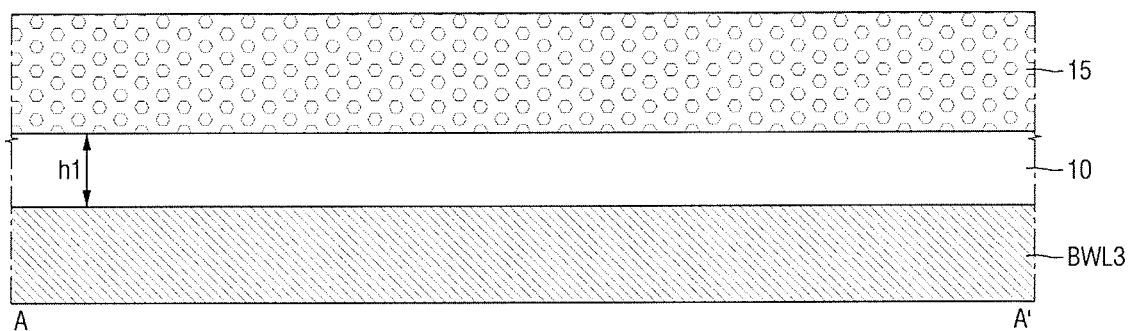
FIGS. 11 to 24 are views illustrating stages of a method for fabricating a semiconductor device according to an exemplary embodiment of the present inventive concept.
Figure 11:
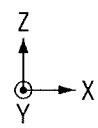

Referring first to FIG. 11, a third lower word line BWL3 extending in the first direction X is formed.

In addition, the first to fourth lower word lines BWL1-BWL4 may be formed simultaneously. For convenience of explanation, only the semiconductor device having a cross section taken along A-A' of FIG. 2 will be described below.

A first mold film 10 with a first height h1 is then formed on the third lower word line BWL3.

The first mold film 10 may be formed on an upper surface and a side surface of the third lower word line BWL3. The first mold film 10 may be formed with the first height h1 beginning from the upper surface of the third lower word line BWL3. In an example, the first height h1 may be the same as the height to which the lower electrode is, when subsequently formed. In an example, the first mold film 10 may include one of SiN, $SiO_2$ and Si.

A first sacrificial film 15 may then be formed on the first mold film 10. The first sacrificial film 15 may include a material different from that of the first mold film 10. For example, the first sacrificial film 15 may include one of SiN, $SiO_2$ and Si. In an example, the materials for the first sacrificial film 15 and the first mold film 10 may be different from each other. For example, the first sacrificial film 15 may include a material having a different etch selectivity from that of the first mold film 10.

Figure 12:
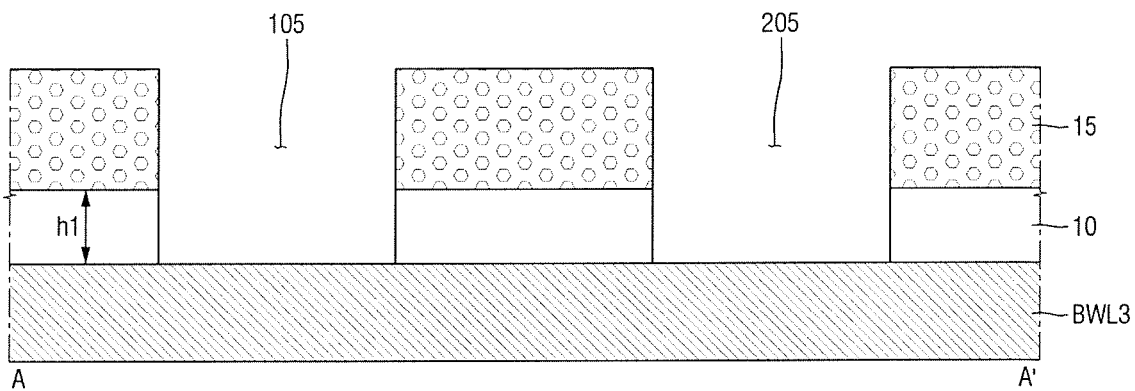
Figure 12:
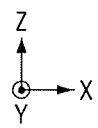

Referring now to FIG. 12, a first through hole 105 and a second through hole 205 are formed, in which the first through hole 105 and the second through hole 205 pass through the first mold film 10 and the first sacrificial film 15 to expose the upper surface of the third lower word line BWL3.

In a subsequent step, the first lower memory cell LC1 may be formed in the first through hole 105, and the second lower memory cell LC2 may be formed in the second through hole 205.

The first through hole 105 and the second through hole 205 may pass through both the first sacrificial film 15 and the first mold film 10 at the same time. Accordingly, the upper surface of the third lower word line BWL3 may be exposed in the vertical direction, i.e., in the third direction Z.

In this case, the width of the first through hole 105 and the second through hole 205 may be greater than about twice the pitch of the first to fourth bit lines BL1-BL4. Accordingly, the first lower memory cell LC1 and the second lower memory cell LC2, which are subsequently formed, may each be in contact with two bit lines, respectively.

Figure 13:
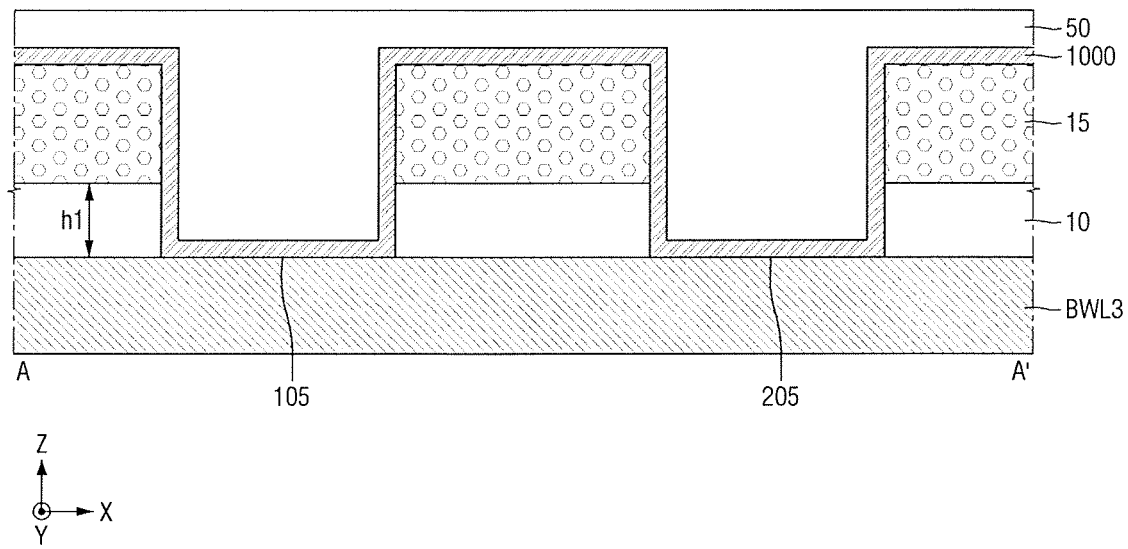

Next, referring to FIG. 13, a lower electrode film 1000 is formed.

For example, the lower electrode film 1000 may include at least one of W, Ti, Al, Cu, C, CN, TiN, TiAlN, TiSiN, TiCN, WN, CoSiN, WSiN, TaN, TaCN, and TaSiN. However, exemplary embodiments of the present inventive concept are not limited to the example given above.

The lower electrode film 1000 may be formed along an upper surface of the first sacrificial film 15, and side surfaces and bottom surfaces of the first through hole 105 and the second through hole 205. For example, the lower electrode film 1000 may be formed along sides surfaces of the first mold film 10 and of the first sacrificial film, and the upper surface of the third lower word line BWL3. The lower electrode film 1000 may fill a portion of the first through hole 105 and the second through hole 205.

The lower electrode film 1000 may exceed the first through hole 105 and the second through hole 205 and may be formed along the upper surface of the first sacrificial film 15.

Next, an inner mold film 50 for filling the first through hole 105 and the second through hole 205 is formed.

The inner mold film 50 may be formed on the lower electrode film 1000. The inner mold film 50 may fill up the first through hole 105 and the second through hole 205 such that the inner mold film 50 may be formed on the upper surface of the lower electrode 1000 positioned on the upper surface of the first sacrificial film 15.

Figure 14:
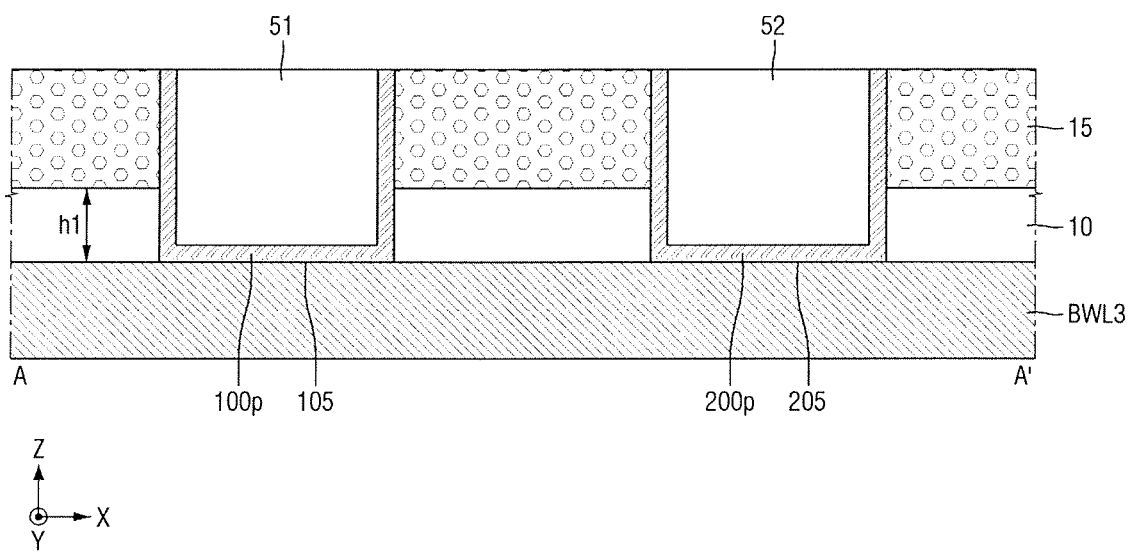

Next, referring to FIG. 14, a portion of the first sacrificial film 15, a portion of the lower electrode film 1000, and a portion of the inner mold film 50 are planarized.

Accordingly, the lower electrode film 1000 may be formed by the first lower electrode film 100p and the second lower electrode film 200p, and the inner mold film 50 may be formed by the first lower cell inner mold film 51 and the second lower cell inner mold film 52.

According to the planarization process, the upper surfaces of the first sacrificial film 15, the first lower electrode film 100p, the second lower electrode film 200p, the first lower cell inner mold film 51, and the second lower cell inner mold film 52 may all be formed on the same plane.

In an example, the planarization process may be chemical mechanical polishing (CMP), but the present inventive concept is not limited thereto.

Figure 15:
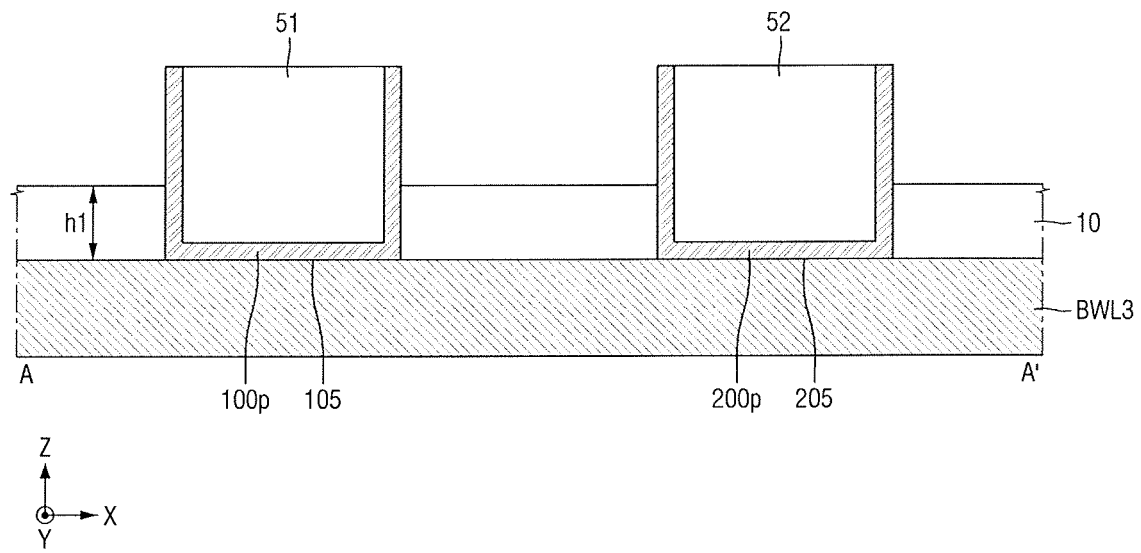

Next, referring to FIG. 15, the first sacrificial film 15 is completely removed.

The first sacrificial film 15 may be completely removed by, for example, the isotropic etching, i.e., wet etching. Instead, the first mold film 10, having an etch selectivity to the first sacrificial film 15, may not be removed, but may remain.

The method for fabricating the semiconductor device according to an exemplary embodiment of the present inventive concept may remove the first sacrificial film 15 with dry etching instead of wet etching.

The removal of the first sacrificial film 15 may expose a portion of each outer side surface of the first lower electrode film 100p and the second lower electrode film 200p. Further, the upper surface of the first mold film 10 may also be exposed. The outer side surfaces of the first lower electrode film 100p and the second lower electrode film 200p may be surrounded by the first mold film 10 as much as the first height h1. For example, the heights of the exposed portions of the outer side surfaces of the first lower electrode film 100p and the second lower electrode film 200p may be constant.

Figure 16:
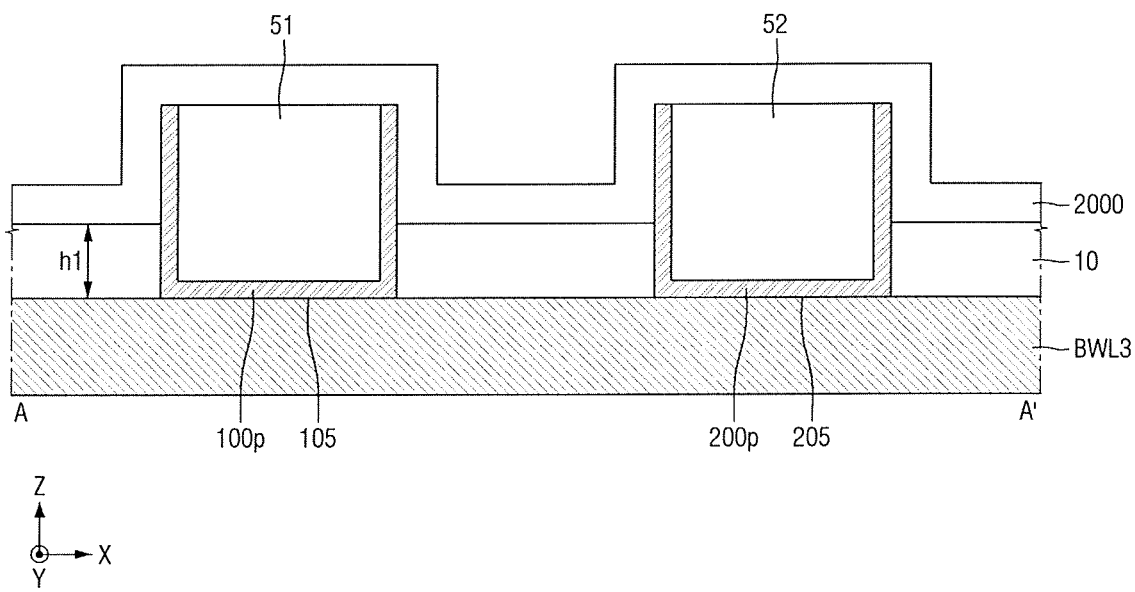

Next, referring to FIG. 16, a spacer film 2000 is formed.

The spacer film 2000 may overlie the upper surface of the first mold film 10, the exposed outer side surfaces of the first lower electrode film 100p and the second lower electrode film 200p, and the upper surfaces of the first lower cell inner mold film 51 and the second lower cell inner mold film 52. The spacer film 2000 may include a material having an etch selectivity to the first mold film 10. For example, the spacer film 2000 may include silicon oxide.

Figure 17:
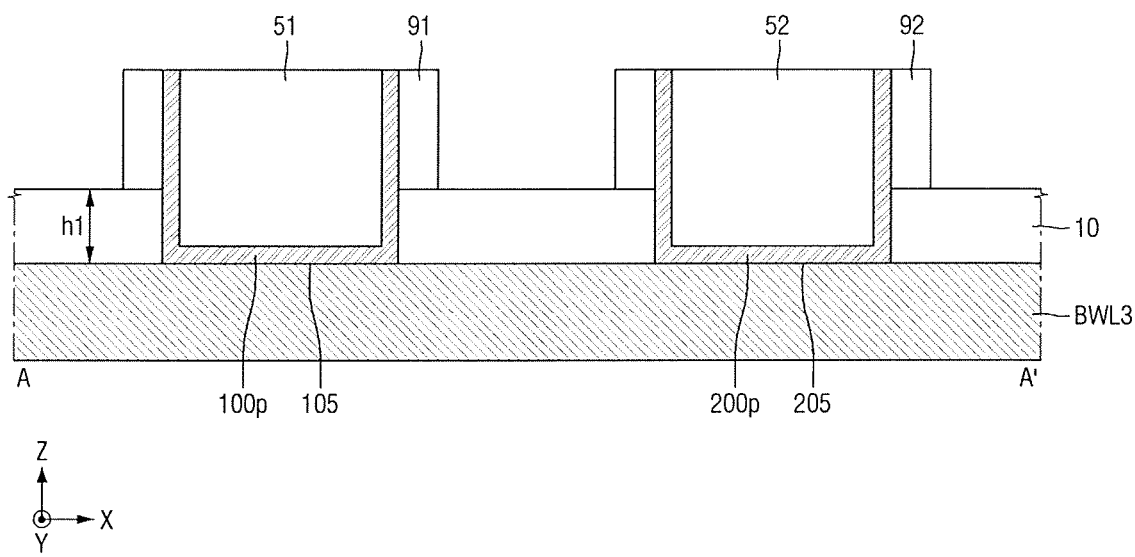

Next, referring to FIG. 17, a portion of the spacer film 2000 is removed.

The removal of the portion of the spacer film 2000 may expose the first lower electrode film 100p, the second lower electrode film 200p, the first mold film 10, the first lower cell inner mold film 51, and the second lower cell inner mold film 52.

Further, the spacer film 2000 may be formed by a first cell spacer 91 and a second cell spacer 92. The first cell spacer 91 may surround the exposed portions of the outer side surfaces of the first lower electrode film 100p, and the second cell spacer 92 may surround the exposed portions of the outer side surface of the second lower electrode film 200p.

Both the first cell spacer 91 and the second cell spacer 92 may be positioned on the upper surface of the first mold film 10. For example, the height of the lower surfaces of the first cell spacer 91 and the second cell spacer 92 may be the same as the first height h1.

Figure 18:
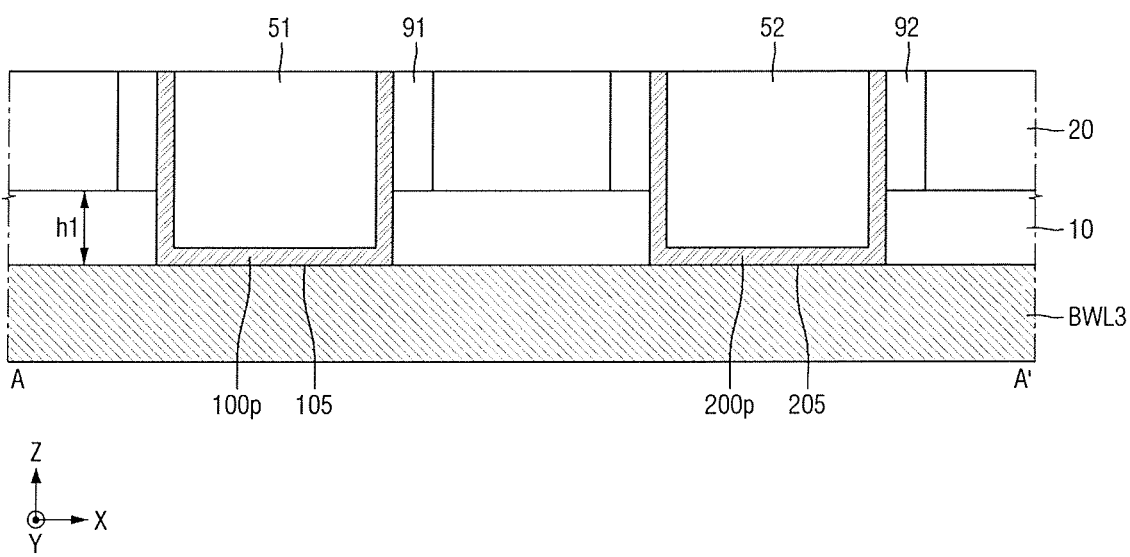

Next, referring to FIG. 18, a second mold film 20 is formed.

The second mold film 20 may be formed so as to completely overlie the upper surface of the first mold film 10. The second mold film 20 may overlie the side surfaces of the first cell spacer 91 and the second cell spacer 92. The second mold film 20 may be formed on the upper surfaces of the first lower cell inner mold film 51 and the second lower cell inner mold film 52. Then, the second mold film 20 may be formed as illustrated in FIG. 18 upon removal of a portion of the second mold film 20 during the planarization process.

Figure 19:
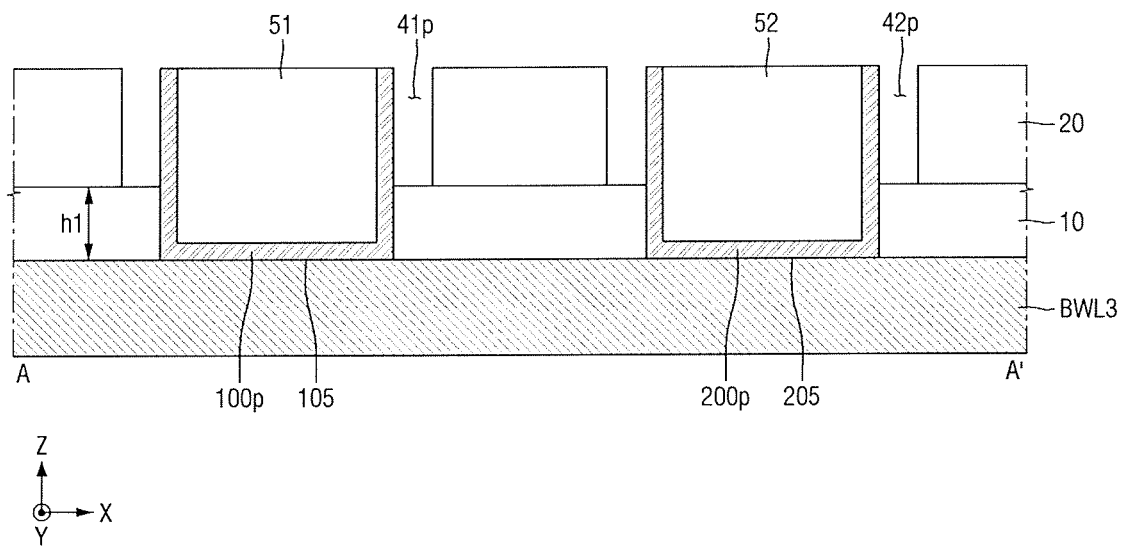

Next, referring to FIG. 19, a first cell spacer 91 and a second cell spacer 92 are completely removed.

The first cell spacer 91 and the second cell spacer 92 may have etch selectivities to the first mold film 10, the second mold film 20, the first lower cell inner mold film 51, the second lower cell inner mold film 52, the first lower electrode film 100p, and the second lower electrode film 200p. Accordingly, the removal of the first cell spacer 91 and the second cell spacer 92 may be performed by wet etching.

In the space left after the removal of the first cell spacer 91 and the second cell spacer 92, a first pre-ring trench 41p and a second pre-ring trench 42p may be formed. The first pre-ring trench 41p may expose a portion of the first lower electrode film 100p, and the second pre-ring trench 42p may expose a portion of the second lower electrode film 200p.

The first pre-ring trench 41p and the second pre-ring trench 42p may have a ring-like cross section on a horizontal plane as defined by the first direction X and the second direction Y. In an example, the heights of the lower surfaces of the first pre-ring trench 41p and the second pre-ring trench 42p may be the first height h1.

Figure 20:
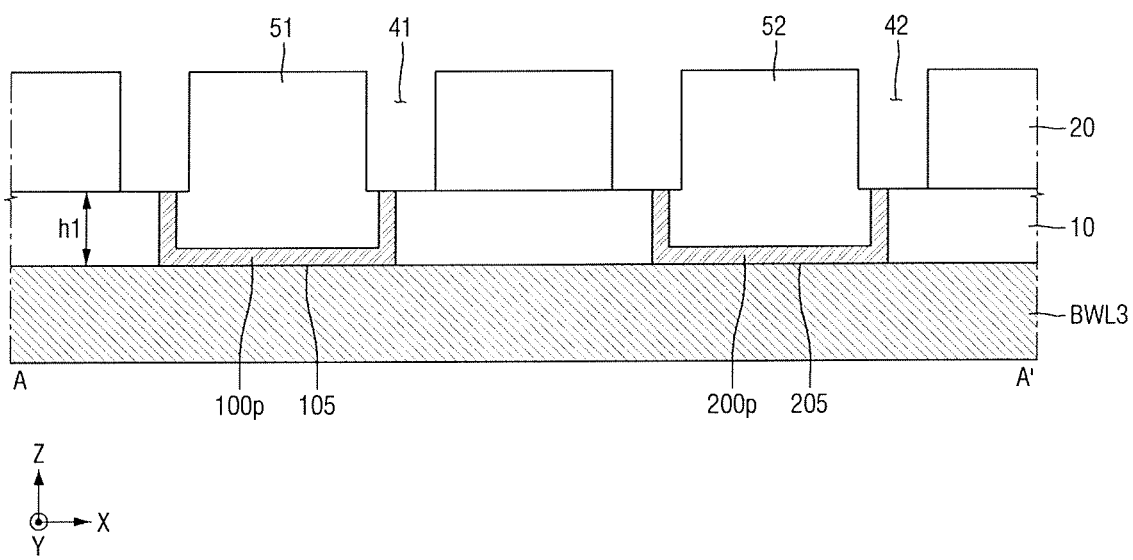

Next, referring to FIG. 20, portions of the first lower electrode film 100p and the second lower electrode film 200p are removed.

The remaining portion of the first lower electrode film 100p after the removal of the portions of the first lower electrode film 100p may become the first lower cell lower electrode 100. The remaining portion of the second lower electrode film 200p after the removal of the portions of the second lower electrode film 200p may become the second lower cell lower electrode 200.

In an example, the heights of the first lower cell lower electrode 100 and the second lower cell lower electrode 200 may be the first height h1. For example, irrespective of where the first lower cell lower electrode 100 and the second lower cell lower electrode 200 are positioned, the first lower cell lower electrode 100 and the second lower cell lower electrode 200 may have heights determined according to the height of the first mold film 10 and may always maintain a constant height, i.e., the first height h1, even at different positions.

Accordingly, a finished form of the semiconductor device can maintain constant distribution of current value (Ireset).

In an example, the side surfaces of the first lower cell inner mold film 51 and the second lower cell inner mold film 52 may be partially removed. Of course, the exemplary embodiments of the present inventive concept are not limited to the specific example provided above. The method for fabricating a semiconductor device according to an exemplary embodiment of the present inventive concept may remove only portions of the first lower electrode film 100p and the second lower electrode film 200p, and might not remove any portions of the first lower cell inner mold film 51 and the second lower cell inner mold film 52.

A portion of the first lower electrode film 100p and the second lower electrode film 200p, which is not exposed due to the first mold film 10, might not be removed. For example, the first mold film 10 may serve as a certain type of etch-stop layer.

The first pre-ring trench 41p and the second pre-ring trench 42p may be formed respectively into a first ring trench 41 and a second ring trench 42 as widths thereof increase.

Figure 21:
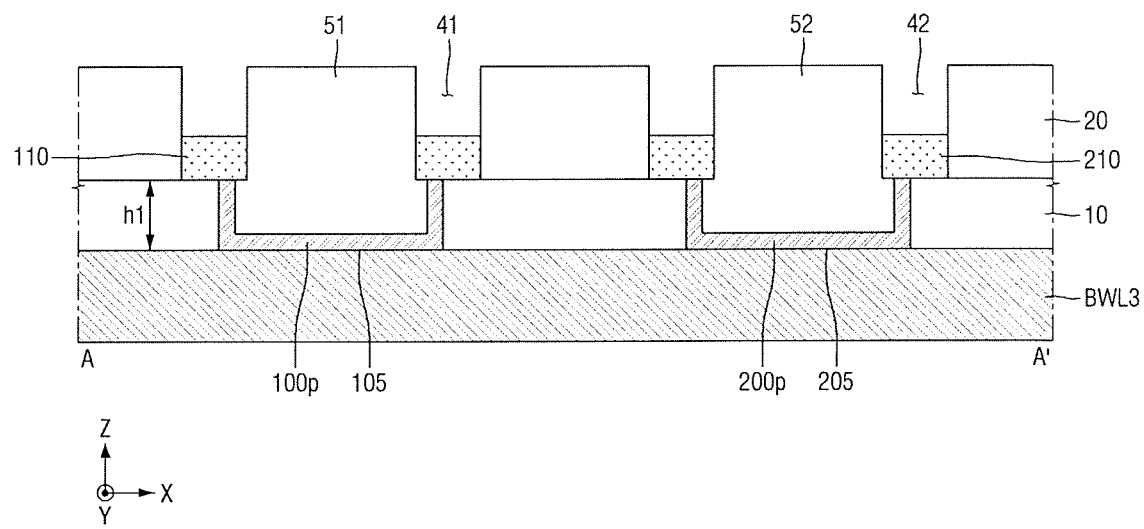

Next, referring to FIG. 21, a first lower cell phase-change memory 110 and a second lower cell phase-change memory 210 are formed.

The first lower cell phase-change memory 110 and the second lower cell phase-change memory 210 may be positioned on the first lower cell lower electrode 100 and the second lower cell lower electrode 200. The first lower cell phase-change memory 110 and the second lower cell phase-change memory 210 may include a phase-change material. The first lower cell phase-change memory 110 and the second lower cell phase-change memory 210 may be composed of various types of materials including, for example, a compound combining two atoms such as GaSb, InSb, InSe, SbTe, GeTe, a compound combining three atoms such as GeSbTe, GeBiTe, GaSeTe, InSbTe, SnSb2Te4, InSbGe, a compound combining four atoms such as AgInSbTe, (GeSn)SbTe, GeSb(SeTe), $Te_{81}Ge_{15}Sb_2S_2$, and so on. Further, the materials mentioned above may be doped with nitrogen (N), silicon (Si), carbon (C), or oxygen (O). For example, GeSbTe doped with nitrogen (N), silicon (Si), carbon (C) or oxygen (O) may be included in the first lower cell phase-change memory 110 and/or the second lower cell phase-change memory 210.

Figure 22:
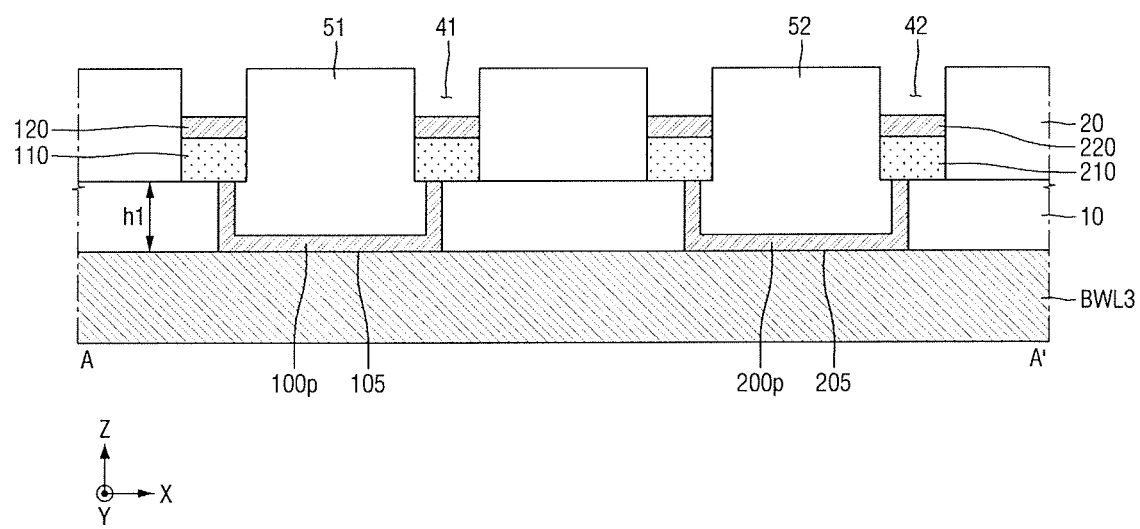

Next, referring to FIG. 22, a first lower cell intermediate electrode 120 and a second lower cell intermediate electrode 220 are formed.

The first lower cell intermediate electrode 120 and the second lower cell intermediate electrode 220 may be formed on the first lower cell phase-change memory 110 and the second lower cell phase-change memory 210, respectively. In addition to the first lower cell lower electrode 100, the second lower cell lower electrode 200, the first lower cell upper electrode 140 and the second lower cell upper electrode 240 described above, the first lower cell intermediate electrode 120 and the second lower cell intermediate electrode 220 may also serve to apply heat to the first lower cell phase-change memory 110 and the second lower cell phase-change memory 210.

The first lower cell intermediate electrode 120 and the second lower cell intermediate electrode 220 may include a conductor. For example, the first lower cell intermediate electrode 120 and the second lower cell intermediate electrode 220 may include at least one of W, Ti, Al, Cu, C, CN, TiN, TiAlN, TiSiN, TiCN, WN, CoSiN, WSiN, TaN, TaCN, and TaSiN.

Figure 23:
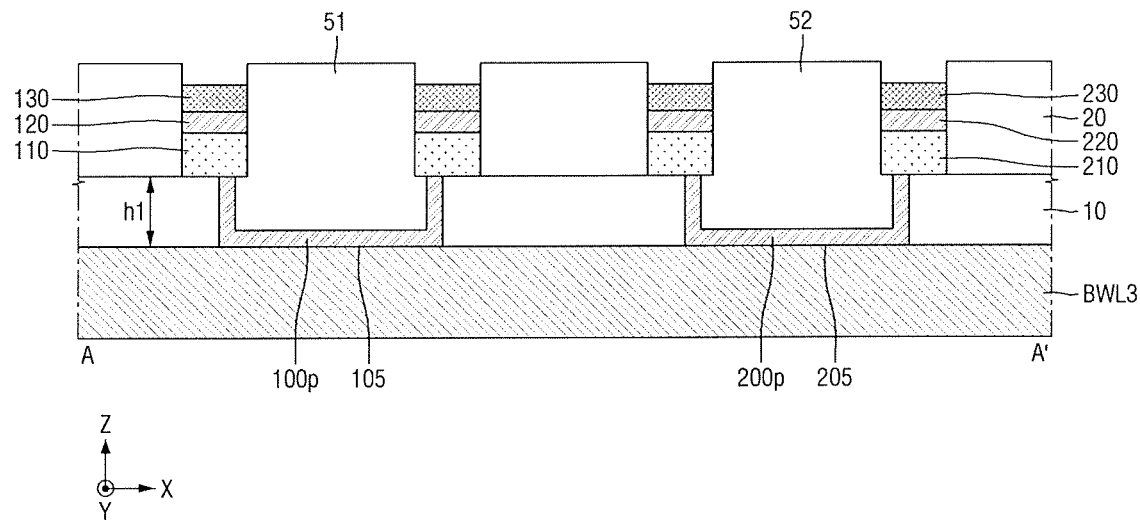

Next, referring to FIG. 23, a first lower cell OTS 130 and a second lower cell OTS 230 are formed.

The first lower cell OTS 130 and the second lower cell OTS 230 may be formed on the first lower cell intermediate electrode 120 and the second lower cell intermediate electrode 220, respectively. The first lower cell OTS 130 and the second lower cell OTS 230 may include chalcogenide. The first lower cell OTS 130 and the second lower cell OTS 230 may switch the state of each of the first lower cell phase-change memory 110 and the second lower cell phase-change memory 210 into one of amorphous ("an on state") and crystalline ("an off state") states. The first lower cell OTS 130 and the second lower cell OTS 230 may each cause the first lower cell phase-change memory 110 and the second lower cell phase-change memory 210 to respectively change their states thereof according to a voltage applied to the first lower cell phase-change memory 110 and the second lower cell phase-change memory 210. Accordingly, they may act as a switch of the memory.

The first lower cell OTS 130 and the second lower cell OTS 230 may respectively switch the state of the first lower cell phase-change memory 110 and the second lower cell phase-change memory 210 according to whether or not the current passing through the first lower cell OTS 130 and the second lower cell OTS 230 exceeds a threshold current, or whether or not the voltage at the first lower cell OTS 130 and the second lower cell OTS 230 exceeds a threshold voltage.

Figure 24:
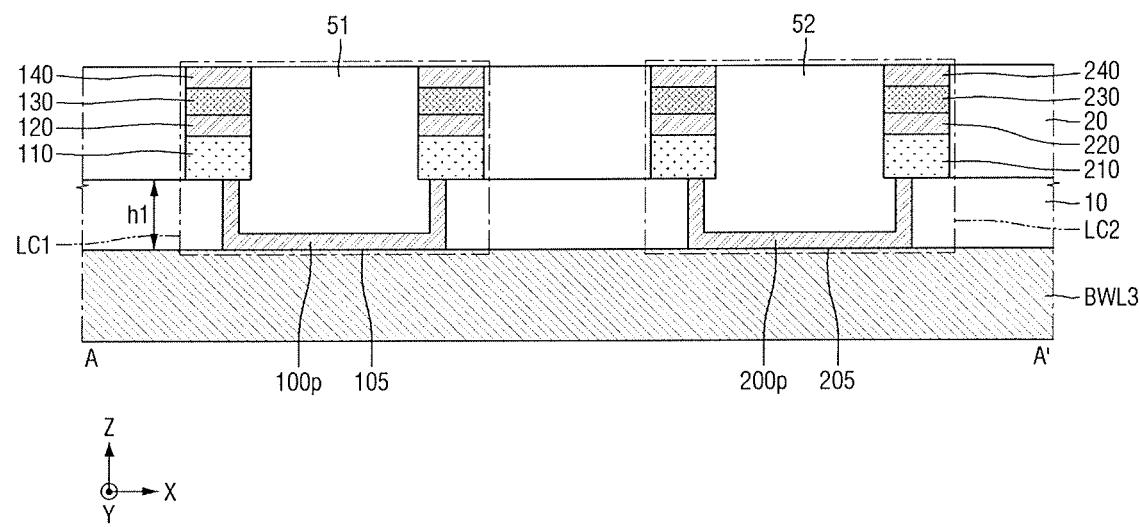

Next, referring to FIG. 24, a first lower cell upper electrode 140 and a second lower cell upper electrode 240 are formed.

The first lower cell upper electrode 140 and the second lower cell upper electrode 240 may be formed on the first lower cell OTS 130 and the second lower cell OTS 230, respectively. In addition to the first lower cell lower electrode 100, the second lower cell lower electrode 200, the first lower cell intermediate electrode 120, and the second lower cell intermediate electrode 220 described above, the first lower cell upper electrode 140 and the second lower cell upper electrode 240 may also serve to apply heat to the first lower cell phase-change memory 110 and the second lower cell phase-change memory 210, respectively.

A semiconductor device according to an exemplary embodiment of the present inventive concept may configure the first lower memory cell LC1 and the second lower memory cell LC2 with the first lower cell lower electrode 100, the second lower cell lower electrode 200, the first lower cell upper electrode 140, and the second lower cell upper electrode 240 only. In addition, the first lower cell intermediate electrode 120 and the second lower cell intermediate electrode 220 may be added to further increase the heating efficiency of the semiconductor device and speed up the memory operation.

The method for forming the first lower memory cell LC1 and the second lower memory cell LC2 described above is also applied to the third to eighth lower memory cells LC3-LC8.

Next, referring to FIG. 4, the first to fourth bit lines BL1-BL4 are formed, and then the first to eighth upper memory cells UC1-UC8 are formed thereon. In an example, the same method for forming the first to eighth lower memory cells LC1-LC8 may be used to form the first to eighth upper memory cells UC1-UC8. Accordingly, the heights of the first through third, fifth and seventh upper cell lower electrodes 150-350, 550 and 750 from the first to fourth bit lines BL1-BL4 may be the same as the second height h2.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A semiconductor device, comprising:
a first word line extending in a first direction;
a first bit line extending in a second direction that intersects the first direction, wherein the first bit line and the first word line are spaced apart from each other in a third direction that intersects the first and second directions;
a mold film disposed between the first word line and the first bit line;
a first memory cell disposed in the mold film and including a core hole, wherein the first memory cell comprises:
a first lower electrode in contact with the first word line, wherein side surfaces of the first lower electrode are in direct contact with the mold film,
a first phase-charge memory in contact with the first lower electrode,
a first intermediate electrode in contact with the first phase-change memory,
a first ovonic threshold switch (OTS) in contact with the first intermediate electrode, and
a first upper electrode disposed between the first OTS and the first bit line, the first upper electrode in contact with the first OTS and the first bit line,
wherein the core hole extends in the first direction through the first lower electrode, the first phase-change memory, the first intermediate electrode, the first OTS and the first upper electrode;
a second bit line extending in the second direction, wherein the second bit line and the first bit line are spaced apart from each other in the first direction; and
a second memory cell disposed between the second bit line and the first word line,
wherein the second memory cell comprises:
a second lower electrode disposed on the first word line, wherein side surfaces of the second lower electrode are in direct contact with the mold film, a second phase-change memory disposed on the second lower electrode, a second intermediate electrode disposed on the second phase-change memory, a second OTS disposed on the second intermediate electrode, and a second upper electrode disposed between the second OTS and the second bit line, the second upper electrode being in contact with the second OTS and the second bit line.

2. The semiconductor device of claim 1, wherein the third direction is a vertical direction.

3. The semiconductor device of claim 1, wherein the mold film comprises at least one of silicon nitride (SiN), silicon dioxide (SiO2) and silicon (Si).

4. The semiconductor device of claim 1, wherein the first OTS comprises chalcogenide.

5. The semiconductor device of claim 1, wherein a width of the first phase-change memory is greater than a width of the first lower electrode, wherein the width of the first phase-change memory and the width of the first lower electrode extend in the first direction.

6. The semiconductor device of claim 1, wherein a height of the first lower electrode is a same as a height of the second lower electrode, wherein the height of the first lower electrode and the height of the second lower electrode extend in the third direction.

7. The semiconductor device of claim 1, further comprising a second bit line extending in the second direction, wherein the second bit line and the first bit line are spaced apart from each other in the first direction, wherein an upper surface of the first memory cell is in contact with both the first and second bit lines.

8. The semiconductor device of claim 7, wherein an inner mold film is disposed in the core hole.

9. The semiconductor device of claim 8, wherein a bottom surface of the core hole is formed by the first lower electrode.

10. A semiconductor device, comprising:

a first word line extending in a first direction;

a second word line extending in the first direction and disposed on the first word line, wherein the second word line is parallel to the first word line;

a first bit line extending in a second direction, which intersects the first direction, and disposed between the first and second word lines;

a first memory cell disposed between the first word line and the first bit line, wherein the first memory cell comprises:

a first lower electrode disposed on the first word line, wherein the first lower electrode includes a first width extending in the first direction, a first phase-change memory disposed on the first lower electrode, wherein the first phase-change memory includes a second width that is greater than the first width, a first OTS disposed on the first phase-change memory, and a first upper electrode disposed between the first OTS and the first bit line; and a second memory cell disposed between the second word line and the first bit line, wherein the second memory cell comprises:

a second lower electrode disposed on the first bit line, wherein the second lower electrode includes a third width extending in the second direction, a second phase-change memory disposed on the second lower electrode, wherein the second phase-change memory includes a fourth width that is greater than the third width, a second OTS disposed on the second phase-change memory, and a second upper electrode disposed between the second OTS and the second word line.

11. The semiconductor device of claim 10, wherein the first memory cell overlaps the second memory cell.

12. The semiconductor device of claim 10, wherein the first lower electrode has a U-shape, from a cross sectional view along the first direction.

13. The semiconductor device of claim 12, wherein the second lower electrode has a U-shape, from a cross sectional view along the second direction.

14. A semiconductor device, comprising:

a first word line extending in a first direction;

a first bit line extending in a second direction crossing the first direction, wherein the first bit line is disposed above the first word line;

a first memory cell disposed on the first word line and comprising:

a core hole, wherein an inner mold film is disposed in the core hole, a first lower electrode disposed on the first word line and having a first height from an upper surface of the first word line, wherein the first lower electrode is in contact with the inner mold film, a first phase-change memory disposed on the first lower electrode at the first height, a first intermediate electrode disposed on the first phase-change memory, a first ovonic threshold switch (OTS) disposed on the first intermediate electrode, and a first upper electrode disposed on the first OTS; and an outer mold film surrounding the first memory cell.

15. The semiconductor device of claim 14, further comprising a second word line disposed on the first word line and extending in the first direction; and a second memory cell surrounded by the mold film, disposed between the second word line and the first bit line, and comprising:

a second lower electrode disposed on the first bit line and having a second height from the first bit line, a second phase-change memory disposed on the second lower electrode at the second height, a second intermediate electrode disposed on the second phase-change memory, a second ovonic threshold switch (OTS) disposed on the second intermediate electrode, and a second upper electrode disposed between the second OTS and the second word line.

16. The semiconductor device of claim 15 wherein the first height and the second height are substantially the same.

17. The semiconductor device of claim 15, wherein the first memory cell is divided into a first-first memory cell and a first-second memory cell by a first cell separator.

18. The semiconductor device of claim 17, wherein the second memory cell overlaps the first memory cell, and the second memory cell is divided into a second-first memory cell and a second-second memory cell by a second cell separator.

* * * * *